(12) United States Patent
Loechelt

(10) Patent No.: US 11,710,767 B2
(45) Date of Patent: *Jul. 25, 2023

(54) DIELECTRIC LATTICE WITH CAPACITOR AND SHIELD STRUCTURES

(71) Applicant: SEMICONDUCTOR COMPONENTS INDUSTRIES, LLC, Phoenix, AZ (US)

(72) Inventor: Gary Horst Loechelt, Tempe, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 183 days.

This patent is subject to a terminal disclaimer.

(21) Appl. No.: 17/248,387

(22) Filed: Jan. 22, 2021

(65) Prior Publication Data

US 2022/0238642 A1 Jul. 28, 2022

(51) Int. Cl.
*H01L 27/07* (2006.01)
*H01L 29/06* (2006.01)
*H01L 49/02* (2006.01)

(52) U.S. Cl.
CPC ...... *H01L 29/0607* (2013.01); *H01L 27/0727* (2013.01); *H01L 28/40* (2013.01)

(58) Field of Classification Search
CPC .. H01L 29/0607; H01L 27/0727; H01L 28/40
See application file for complete search history.

(56) References Cited

U.S. PATENT DOCUMENTS

| 10,304,933 | B1 | 5/2019 | Woo et al. |
| 2010/0006979 | A1 | 1/2010 | Krutsick |
| 2015/0137225 | A1 | 5/2015 | Lui et al. |
| 2017/0084687 | A1 | 3/2017 | Grivna et al. |
| 2018/0294332 | A1 | 10/2018 | Loechelt |
| 2019/0181217 | A1 | 6/2019 | Kang et al. |
| 2022/0238512 | A1* | 7/2022 | Loechelt ................. H01L 28/20 |

\* cited by examiner

*Primary Examiner* — Samuel A Gebremariam
(74) *Attorney, Agent, or Firm* — Brake Hughes Bellermann LLP

(57) ABSTRACT

In a general aspect, a semiconductor device can include a semiconductor region, an active region disposed in the semiconductor region, and a termination region disposed on the semiconductor region and adjacent to the active region. The termination region can include a trench having a conductive material disposed therein. The termination region can further include a first cavity separating the trench from the semiconductor region. A portion of the first cavity can be disposed between a bottom of the trench and the semiconductor region. The termination region can also include a second cavity separating the trench from the semiconductor region.

20 Claims, 36 Drawing Sheets

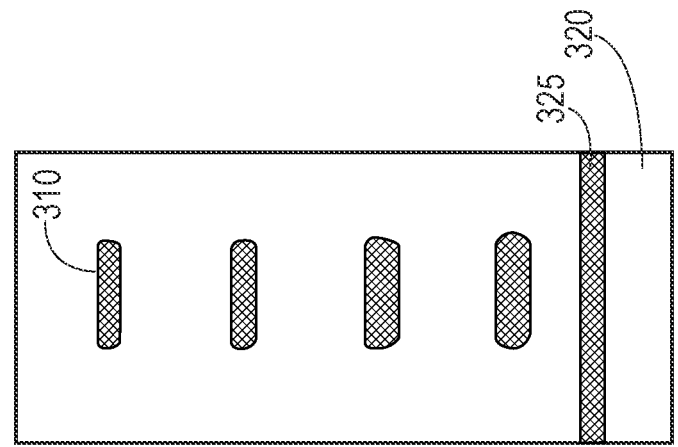
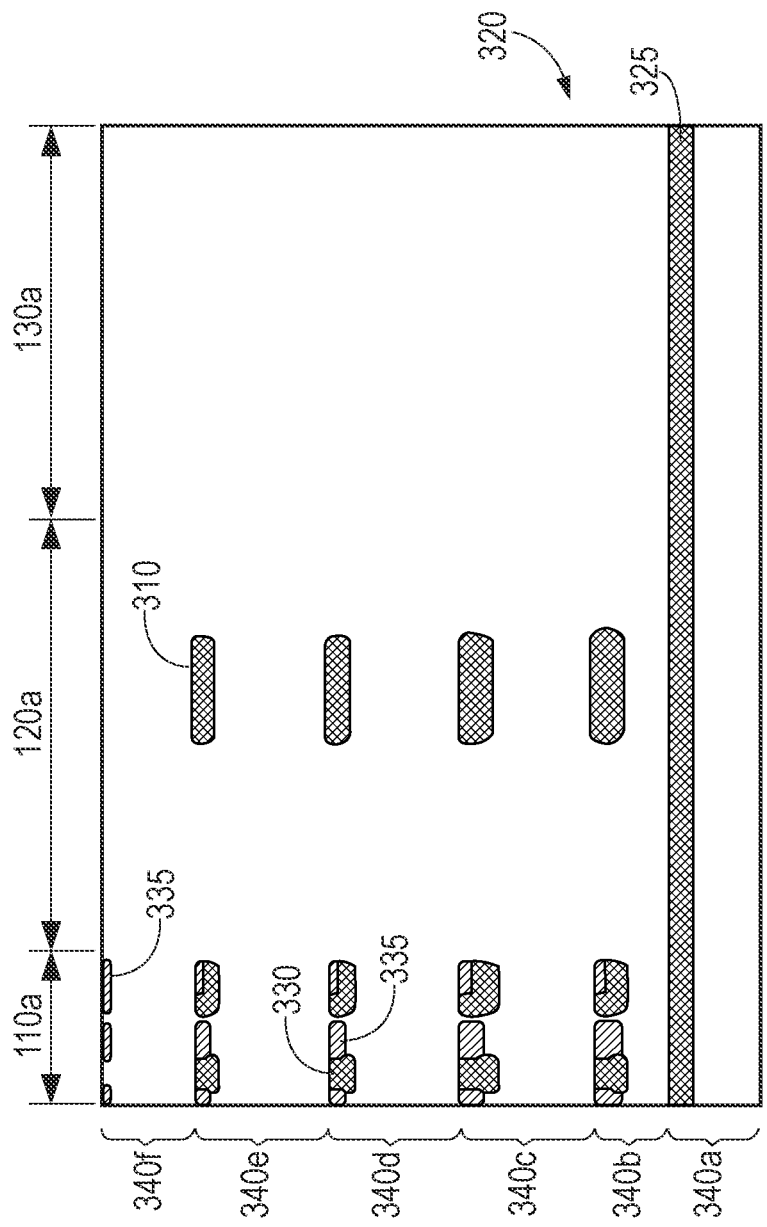

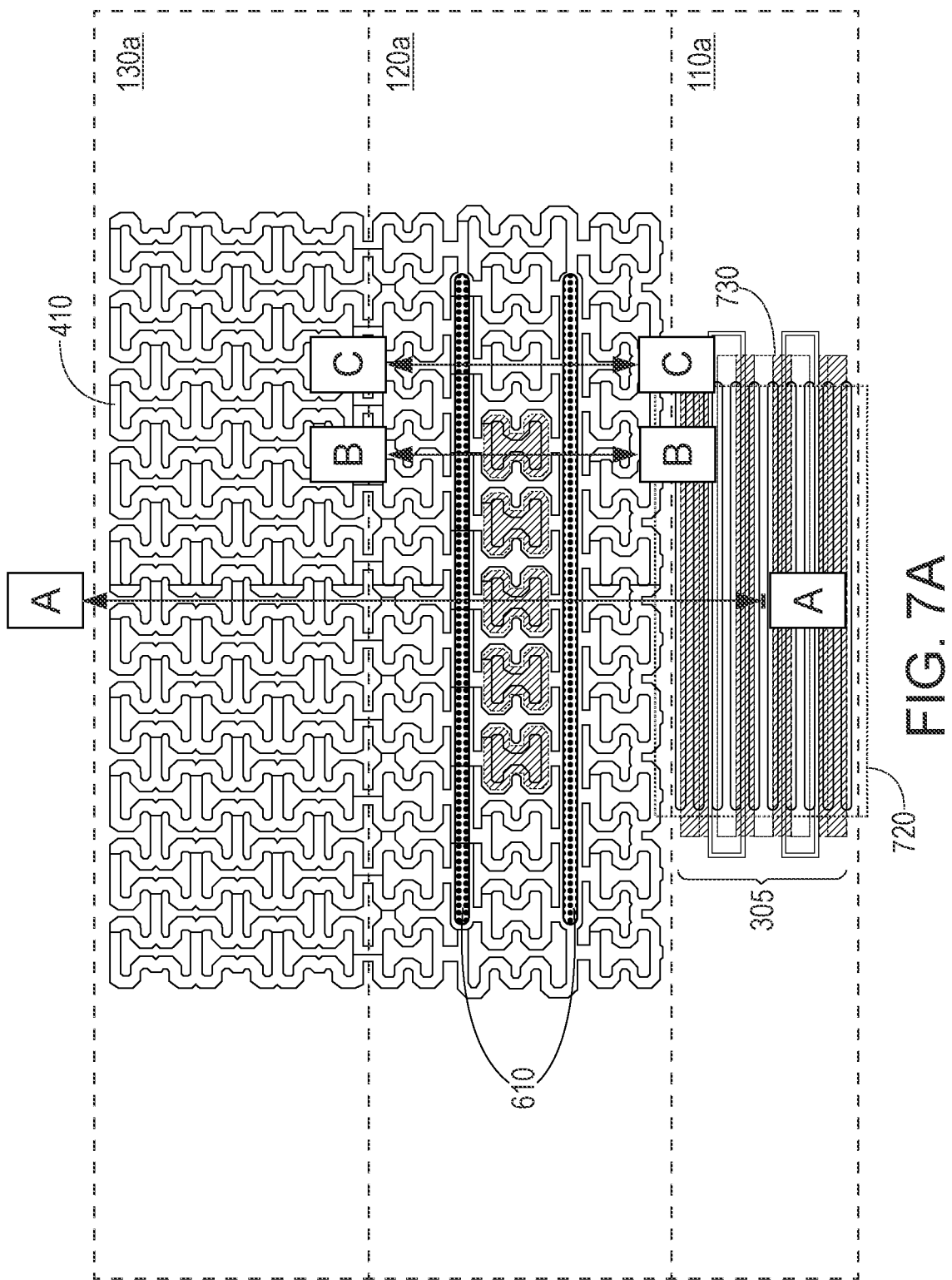

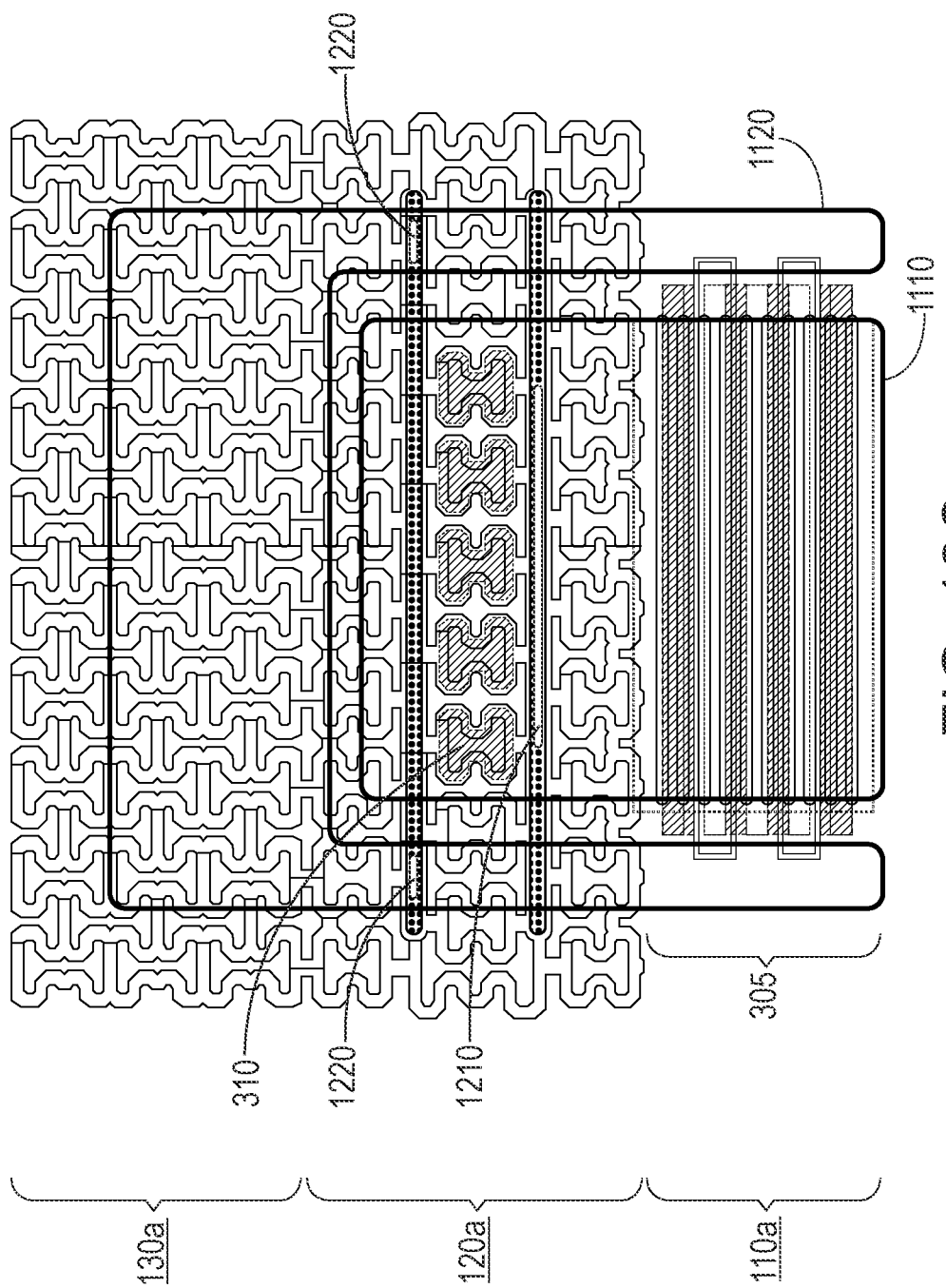

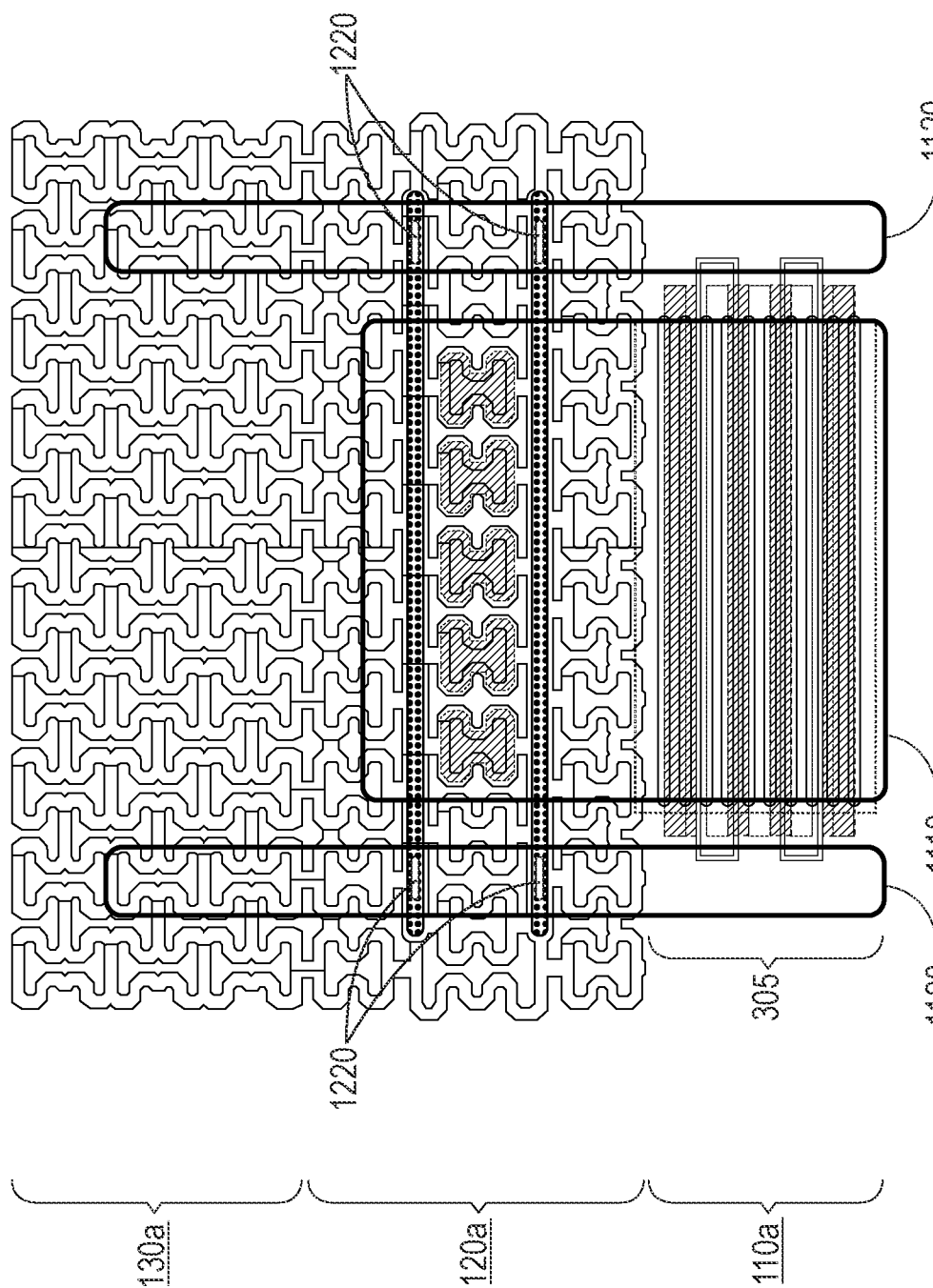

DIELECTRIC LATTICE WITH CAPACITOR AND SHIELD STRUCTURES

TECHNICAL FIELD

This description relates to capacitor, resistor and shield structures that can be implemented in a dielectric lattice (matrix, network, web, etc.), such as in a termination region of a power semiconductor device.

BACKGROUND

Power transistors (e.g., operating at 250 volts, or higher), such as power metal-oxide-semiconductor field-effect transistors (MOSFETs) are used in a number applications. For instance, these applications can include automotive applications, use in power converters, industrial applications, consumer electronic applications, and so forth. In such applications, due to the combination of high operating voltages, non-linear output capacitance (e.g., of a power MOSFET, such as of a superjunction MOSFET) and parasitic inductance (e.g., from device packaging for the MOSFET and/or an associated circuit board), undesired signal (e.g., voltage and/or current) ringing (e.g., transient signal overshoot and/or undershoot) can occur, e.g., on drain and/or gate terminals of the MOSFET.

In order to reduce such ringing, passive components can be used, such as resistors and/or snubbing capacitors. However, adding such passive components, particularly when those components are implemented external to the MOSFET (e.g., not integrated on a same semiconductor device), can introduce additional parasitic inductance, which can decrease or eliminate the effectiveness of the added components in reducing ringing.

Further, implementing such components (e.g., snubbing capacitors) as integrated components can have drawbacks as well. For instance, due to the high operating voltages associated with power MOSFETs, thick dielectric (e.g., oxide) films are used for producing such integrated capacitors. These films can be difficult to produce and/or expensive to produce (e.g., due to semiconductor substrate area used, as well as associated semiconductor processing costs). Such films can also have reliability issues due to stresses on those films that can within a semiconductor device (e.g., due to thermal mismatch issues, etc.), and/or can negatively impact (reduce) a breakdown voltage of an associated MOSFET (e.g., due to defect densities of such thick films). Accordingly, alternative approaches for implementing such passive components are desired.

SUMMARY

In a general aspect, a semiconductor device can include a semiconductor region, an active region disposed in the semiconductor region, and a termination region disposed on the semiconductor region and adjacent to the active region. The termination region can include a trench having a conductive material disposed therein. The termination region can further include a first cavity separating the trench from the semiconductor region. A portion of the first cavity can be disposed between a bottom of the trench and the semiconductor region. The termination region can also include a second cavity separating the trench from the semiconductor region.

In another general aspect, a capacitor can include a semiconductor region defining a first plate of the capacitor, and a trench having a conductive material disposed therein. The conductive material can define a second plate of the capacitor. The capacitor can further include a cavity separating the trench from the semiconductor region. A portion of the cavity can be disposed between a bottom of the trench and the semiconductor region. The cavity can be included in a dielectric of the capacitor.

In another general aspect, a semiconductor device can include a semiconductor region, an active region disposed in the semiconductor region, and a metal-oxide-semiconductor field-effect transistor (MOSFET) disposed in the active region. The semiconductor device can also include a termination region disposed on the semiconductor region and adjacent to the active region. The termination region can include a trench having a conductive shield material disposed therein, and a first cavity separating the trench from the semiconductor region. A portion of the first cavity can be disposed between a bottom of the trench and the semiconductor region. The termination region can further include a second cavity separating the trench from the semiconductor region.

BRIEF DESCRIPTION OF THE DRAWINGS

FIGS. 3A-3C, FIGS. 4A-4D, FIGS. 5A-5C, FIGS. 6A-6D, FIGS. 7A-7D, FIGS. 8A-8D, FIGS. 9A-9D, FIG. 10, and FIGS. 11A-11D are diagrams that illustrate a process for producing a semiconductor device including trench structures implemented in a dielectric lattice.

FIGS. 12A-12G are diagrams illustrating various layout views of implementations of dielectric lattice implemented trench structures.

Figure 1A:
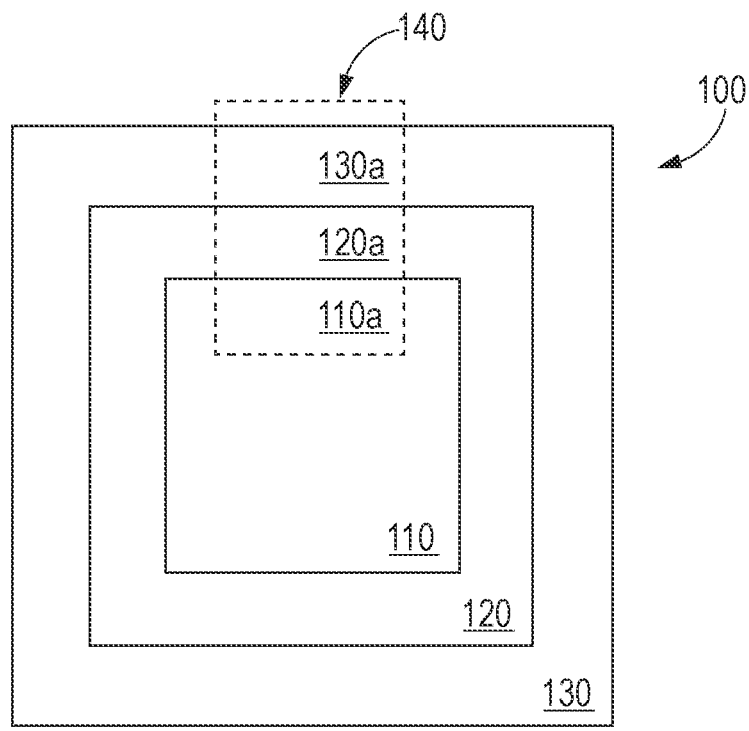
FIG. 1A is a block diagram that schematically illustrates a plan view of a semiconductor device including multiple regions.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated in a given view.

DETAILED DESCRIPTION

The present disclosure is directed to trench-implemented structures that can address at least some of the drawbacks noted above. For instance, this disclosure is directed to trench implemented passive devices, such as capacitors and resistors, that can be included in a (three-dimensional) dielectric lattice (web, matrix, network, framework, etc.), where the dielectric lattice can be included in a termination region of a power semiconductor device. In some implementations, such as the example implementations described here, such a dielectric lattice be implemented as an oxide lattice, such as using silicon dioxide, as one example.

Such passive devices can be used to implement integrated (e.g., on a same semiconductor device) snubbing devices (e.g., capacitors and/or resistors) for power transistors, such as superjunction metal-oxide-semiconductor field-effect transistors (MOSFETs). Such approaches can reduce signal ringing (e.g., source and/or drain) without adding a significant amount of parasitic inductance. The trench-implemented structures described herein can include vertically arranged features (e.g., orthogonal to a surface of a semiconductor region (substrate, die, etc.)), such that they consume less layout area, or less semiconductor area of an associated semiconductor die. Also, the trench-implemented structures described herein can include air gaps that, in combination with thin dielectric (oxide) films, can implement capacitor dielectrics, which can prevent the reliability issues of thick oxide films noted above, and can be less expensive to produce than devices with thick dielectric films.

The trench-implemented structures described herein can also be used to implement shield structures (e.g., in a dielectric lattice termination region), where such shield structures can prevent detrimental impacts on breakdown voltage, e.g., of an associated power MOSFET, that can be related to (result from, be attributed to, caused by, etc.) any corresponding trench implemented passive devices, such as those described herein. In some implementations, use of such shield structures can, in fact, improve (increase) a breakdown voltage of an associated power MOSFET. For instance, such shield structures can be disposed around (partially around) an active area of a power semiconductor device, such as an active area including a superjunction MOSFET, or other power transistor. In some implementations, such shield structure(s) can be continuous, or can be implemented in segments, and can isolate a corresponding active area from any (trench-implemented) passive devices that are also disposed in an associated dielectric lattice termination region. In some implementations, such an arrangement can improve a corresponding breakdown voltage by preventing breakdown from occurring in, or as a result of, one or more of the passive devices (e.g., by shielding such passive devices from high electric fields present in the active region).

Further, the approaches described herein provide for producing trench-implemented structures that include integrated capacitors, resistors and local interconnect structures. That is, the approaches described herein can be used to implement passive components (e.g., in a modular. passive component circuit) and corresponding interconnects that can be integrated on a semiconductor die (semiconductor substrate, etc.) with a power semiconductor device, such as a power MOSFET. For instance, in some implementations, the trench-implemented structures described herein can be implemented using a common, modular layout that can group different functionalities (capacitor, resistor, shield, etc.) into a single passive component circuit, where a particular functionality of a given block can be selected (or a given block can be disabled) based on one or two semiconductor layers (e.g., a contact mask and/or a signal metal mask).

Such modular designs can also reduce design, process development and qualification work, as a given semiconductor device including a plurality of such modular blocks can be designed, characterized and qualified once. After design, characterization and qualification, custom configurations can then be produced to implement desired, respective functionalities of such modular blocks of a given semiconductor device (e.g., based on a particular application, customer requirements, etc.). Such functionalities can include those described herein, including disabling one or more modular, passive component circuits (e.g., by modifying contacts, removing contacts, and/or modifying signal metal). Accordingly, such implementations can provide quick time-to-market for such custom configurations, and can be scalable across different technologies.

Figure 1B:
FIG. 1B is a block diagram that schematically illustrates a portion of the semiconductor device of FIG. 1B

FIG. 1A is a block diagram that schematically illustrates a plan view of a semiconductor device 100 including multiple regions, while FIG. 1B is a block diagram that schematically illustrates a portion of the semiconductor device 100 of FIG. 1A. FIGS. 1A and 1B, as discussed below, are provided by way of example and as context for the example implementations shown in the remaining figures (e.g., FIGS. 2-14B). Referring to FIG. 1A, the semiconductor device 100 includes an active region 110, a passive component region 120 and a termination region 130. In some implementations, the active region can included one or more power semiconductor devices, such as one or more power (e.g., superjunction) MOSFETs, one or more power diodes, one or more trench insulated-gate bipolar, transistors (IGBTs), etc. The specific device, or devices included in the active region 110 will depend on the specific implementation.

In the example implementation of FIG. 1A, the semiconductor device 100 is illustrated as including the passive component region 120 and the termination region 130, as separate, and distinct regions. However, in some implementations, the passive component region 120 and the termination region 130 can be implemented as a single region, which can implement both a termination region and a passive device region of a semiconductor device. For purposes of discussion and illustration in this disclosure, the disclosed example implementations are described as, consistent with FIG. 1A (and FIG. 1B), as including the passive component region 120 and termination region 130.

Referring still to FIG. 1A, a dashed line inset 140 is shown, where the dashed line inset 140 highlights (identifies, etc.) a portion of the semiconductor device 100 that includes respective portions of the active region 110, the passive component region 120 and the termination region 130. That is, the dashed line inset 140 includes a portion 110a of the active region 110, a portion 120a of the passive component region 120 and a portion 130a of the termination region 130. These portions correspond with the example implementations shown in FIGS. 2 to 14B, and are referenced below with respect to the discussion of those figures.

Figure 2:
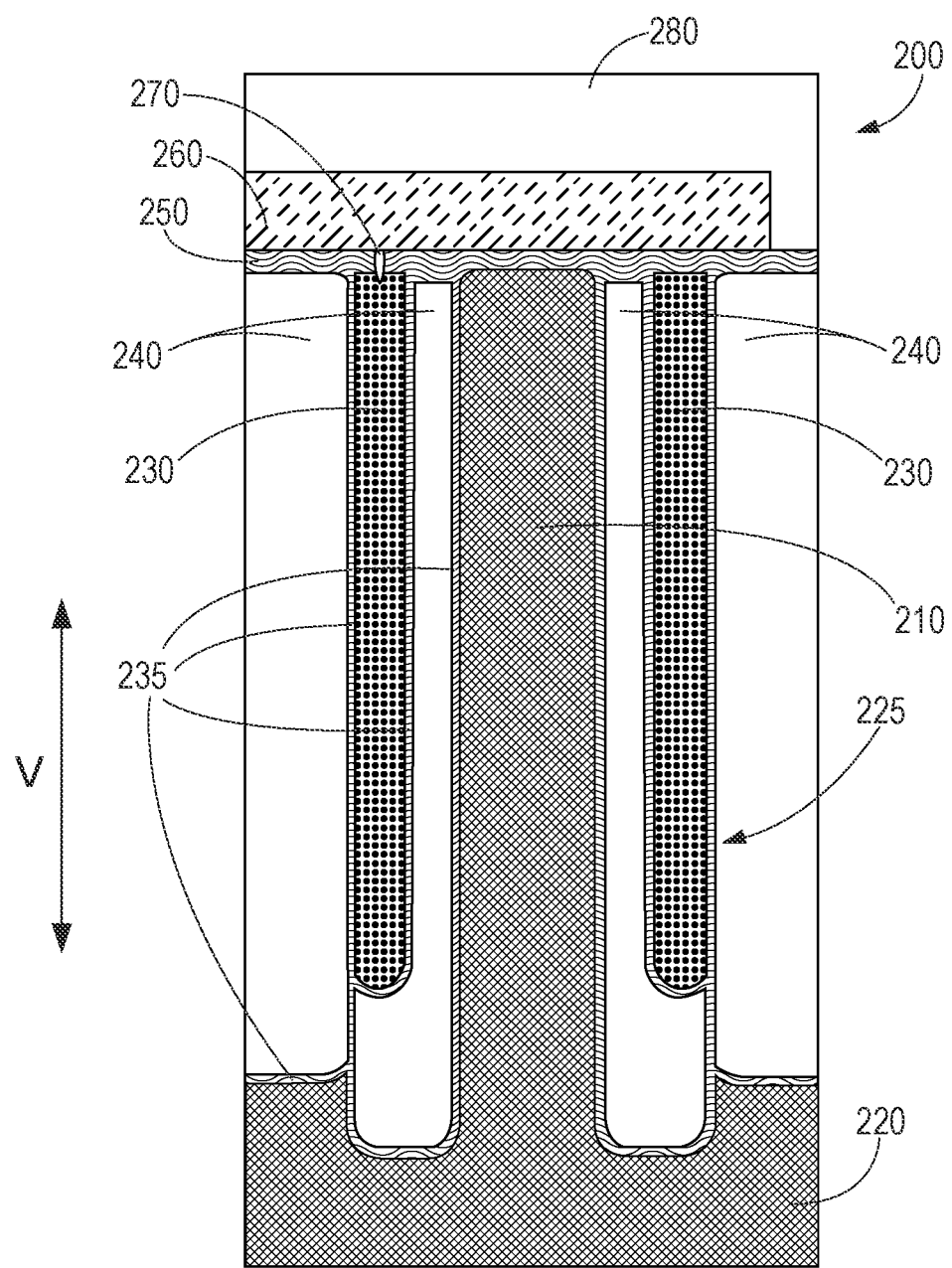
FIG. 2 is a diagram illustrating a cross-sectional view of a trench structure that can be implemented in a dielectric lattice.

FIG. 2 is a diagram illustrating a cross-sectional view of a trench-implemented structure 200 that can be implemented in a dielectric lattice. The trench-implemented structure 200 can be included in a passive component circuit, such as those discussed herein. The trench-implemented structure 200 of FIG. 2 is provided for purposes of illustration, as a brief example of such trench-implemented structures (e.g., structures that can be used to implement passive devices and or shield structures, such as in a dielectric film lattice (matrix, web, framework, etc.) that implements a termination region of a power semiconductor device.

As shown in FIG. 2, the trench-implemented structure 200 includes a semiconductor pillar 210 that can be defined from a semiconductor region 220 (e.g., using a process such as described herein). The semiconductor region 220 can be, for example, an n-type semiconductor region, such as a semiconductor region 220 that includes one or more epitaxial silicon layers that are doped with an n-type impurity (e.g., in the pillar 210). In some implementations, such epitaxial layers (of the semiconductor region 220) can be disposed on a highly doped n-type substrate. While a separate highly doped substrate is not specifically shown in FIG. 2, in some implementations, the semiconductor region 220 can include such a highly doped substrate.

The trench-implemented structure 200 of FIG. 2 also includes a plurality of trenches 225. The trenches 225 of the trench-implemented structure 200 are defined by a plurality of dielectric films 235 that are included in a three-dimensional dielectric film lattice (matrix, web, framework, etc.), which can be referred to herein as a dielectric lattice. In some implementations, the dielectric films 235 of such a dielectric lattice can include vertical (with respect the semiconductor region 220 underlying the dielectric lattice), lateral, and connecting dielectric films 235. These films also can extend into and out of the page in FIG. 2, thus defining a three-dimensional dielectric lattice, such as further discussed herein.

As shown in FIG. 2, the dielectric films 235 can define sidewalls and bottoms (e.g., walls) of the trenches 225 in the trench-implemented structure 200, and the trenches 225 can be filled with conductive material 230 (e.g., doped polysilicon). The dielectric films 235 of the trench-implemented structure 200 can also define a plurality of cavities 240 within the dielectric lattice. Such cavities 240 can also be referred to as air gaps, open space, openings, etc. In some implementations, the cavities 240 can, in combination with the dielectric films 235, act as a dielectric of a capacitor implemented by the trench-implemented structure 200.

The trench-implemented structure 200 also includes a dielectric cap layer 250, which can be an inter-layer dielectric between a signal metal layer 260 and the underlying elements (e.g., the pillar 210 and the conductive material 230) of the semiconductor region 220. As also shown in FIG. 2, the trench-implemented structure 200 also includes a contact 270 (e.g., an ohmic contact) between the signal metal layer 260 and the conductive material 230 of the left trench of the trenches 225 in FIG. 2. In some implementations, such an arrangement can implement a capacitor including the conductive material 230 of that trench (as a first plate) and the pillar 210 (as a second plate), with the cavity 240 between the left trench 225 and the pillar 210, along with dielectric films 235 defining the left trench and the dielectric films 235 disposed on (e.g., surrounding) the pillar 210 and on the semiconductor region 220, being included in a dielectric of the capacitor.

In some implementations, such as the example implementations described herein, the conductive material 230 in the trenches 225 can be used to implement capacitors (such as discussed above, and further below), resistors, and/or shield structures. As shown in FIG. 2, and which also applies to other embodiments herein, the trenches 225 can, along the line V (wherein the line V is orthogonal to the semiconductor region 220), can be suspended above the semiconductor region 220 by the dielectric films 235 of the dielectric lattice. As also shown in FIG. 2, the trench-implemented structure 200 can also include a passivation layer 280 (e.g., a densified glass layer), which is disposed on the signal metal layer 260 and the dielectric cap layer 250, and can protect those layers from damage.

FIGS. 3A through 11D are diagrams that illustrate a process (a semiconductor manufacturing process) for producing a semiconductor device including a passive component circuit having trench structures implemented in a dielectric lattice. In FIGS. 3A-11D, the example semiconductor device is shown at various points in the illustrated semiconductor process. As indicated above, FIGS. 3A through 11D correspond with the dashed line inset 140 and the portion 110a, the portion 120a and the portion 130a of an implementation of the semiconductor device 100, such as shown in FIGS. 1A and 1B. In FIGS. 3A through 11D, each of FIGS. 3A, 4A, 6A, 7A, 8A, 9A, 10A and 11A illustrate top-down, design layout views. That is, those figures illustrate overlaid masking layers that are used to produce photolithography masks, where those photolithography masks are then used to produce (process, etc.) a corresponding semiconductor device. Also for FIGS. 3A, 4A, 6A, 7A, 8A, 9A and 11A, the figures include corresponding cross-sections that are indicated in each respective top down view, e.g., by section lines A-A, B-B and C-C in the layout views. FIGS. 5A-5C illustrate pillar diffusion and sacrificial polysilicon deposition operations. FIG. 10A illustrates a top down (layout) view including a contact (e.g., for defining ohmic contacts) without corresponding cross-sections.

Also, for purposes of brevity, not all processing steps are specifically illustrated or described in detail in FIGS. 3A-11D. For instance, multiple semiconductor processing operations can be illustrated by each set of figures (e.g., FIGS. 3A-3C, FIGS. 4A-4D, etc.). For example, photolithography masks (e.g., photoresist masks, hard masks using silicon nitride or oxide, etc.) that are produced using (or based on) the making layers of the layout views (as well as subsequent removal of those masks) may not be shown. Instead, the structures resulting from use of such masking layers (as shown in the top down views) and associated processing operation may be illustrated, where associated processing operations can include one or more of photolithography operations, oxidation operations, deposition operations, implant operations, diffusion operations, etch operations, polish operations, and so forth.

Further, FIGS. 3A-11D illustrate producing a superjunction MOSFET 305 in the portion 110a of the active region 110 shown in these figures. Also for purposes of brevity, specific details for producing the MOSFET 305 may not be discussed herein. It is noted that the process of FIGS. 3A-11D is given by way of example. A number of variations, such as those described herein, are possible (e.g., use of undoped semiconductor pillars, use of a single trench with multiple pillars or pillar rows, use of multiple trenches with a single pillar or row of pillars, reversing conductivity types of one or more features, changing the order of processing operations, etc.)

Figure 3A:
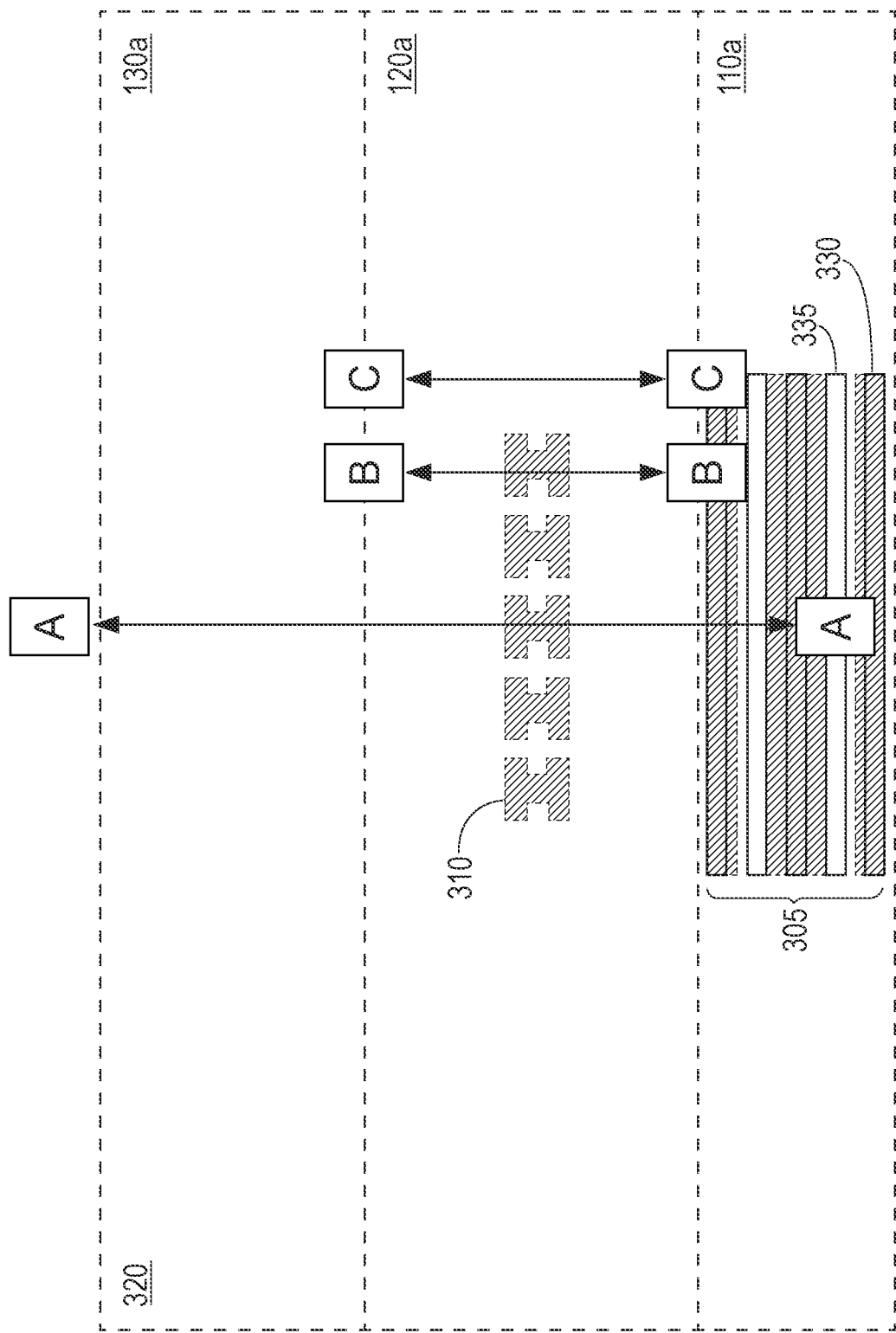

FIGS. 3A through 3C are diagrams illustrating formation of pillar implants (n-pillar implants and p-pillar implants) of the example semiconductor device, e.g., based on a first mask (n-pillar mask) and a second mask (p-pillar mask). As shown in FIG. 3A, n-type pillars 310 (semiconductor region pillars) can be defined in the portion 120a, while both n-type pillars 330 and p-type pillars 335 of the MOSFET 305 can be formed in the portion 110a. As noted above, FIG. 3A includes the sections lines A-A, B-B and C-C, where section line A-A, as shown, extends through portion 110a, portion 120a and portion 130a, and through the center of one of the n-type pillars 310. The section line B-B is located in the portion 120a and extends through a second pillar of the n-type pillars 310, but is offset from the section line A-A. This offset (in the corresponding cross-sections of the FIGS. 3A-11C) shows differences in structure (e.g., of a dielectric film lattice) produced in this example. The section line C-C is located in the portion 120a, but does not extend through a pillar. That is, at this point in the process, the section line C-C is a section line through a semiconductor region (e.g., undoped epitaxial semiconductor layers) that can be used to produce the example semiconductor device.

FIG. 3B is a cross-sectional view corresponding with section line A-A in FIG. 3A. In FIG. 3B, portion 110a, portion 120a and portion 130a of FIG. 3A are indicated. As shown in FIG. 3B, a semiconductor region 320 can include epitaxial layers 340a, 340b, 340c, 340d, 340e and 340f (e.g., undoped), which can each be implanted with n-type and/or p-type impurities (pillar implants) before formation of each subsequent epitaxial layer. For instance, the epitaxial layer 340a can be implanted (blanket implanted) with an n-type buffer layer 325 prior to forming the epitaxial layer 340b.

The epitaxial layers 340b, 340c, 340d and 340e can then be produced, with n-pillar implants for the pillars 310 in the region 120a, and pillars (n-pillars 330 and p-pillars 335) of the MOSFET 305 in the portion 110a using their respective photomasks to produce implant mask. That is, in this example, the process of epitaxial layer formation and associated n-type and p-type implants can be repeated four times. After formation of the epitaxial layer 340e, the epitaxial layer 340f can be performed and a final implant for the pillars 335 can be done in the epitaxial layer 340f, as shown in FIG. 3B. Referring to FIG. 3C, which corresponds with the section line B-B in FIG. 3A, the structure of the semiconductor region 320, the n-type buffer layer 325 and the implants for the n-type pillars 310 are shown. A cross-section for section line C-C corresponding with FIG. 3A is not shown, as that cross-section would comprise the epitaxial layers 340b-340e disposed on the epitaxial layer 340a with the n-type buffer layer 325. As noted above, in some implementations, though not specifically shown in FIGS. 3A-11D, the semiconductor region 320 can be formed on a heavily doped semiconductor substrate (e.g., n-type substrate).

Figure 4A:
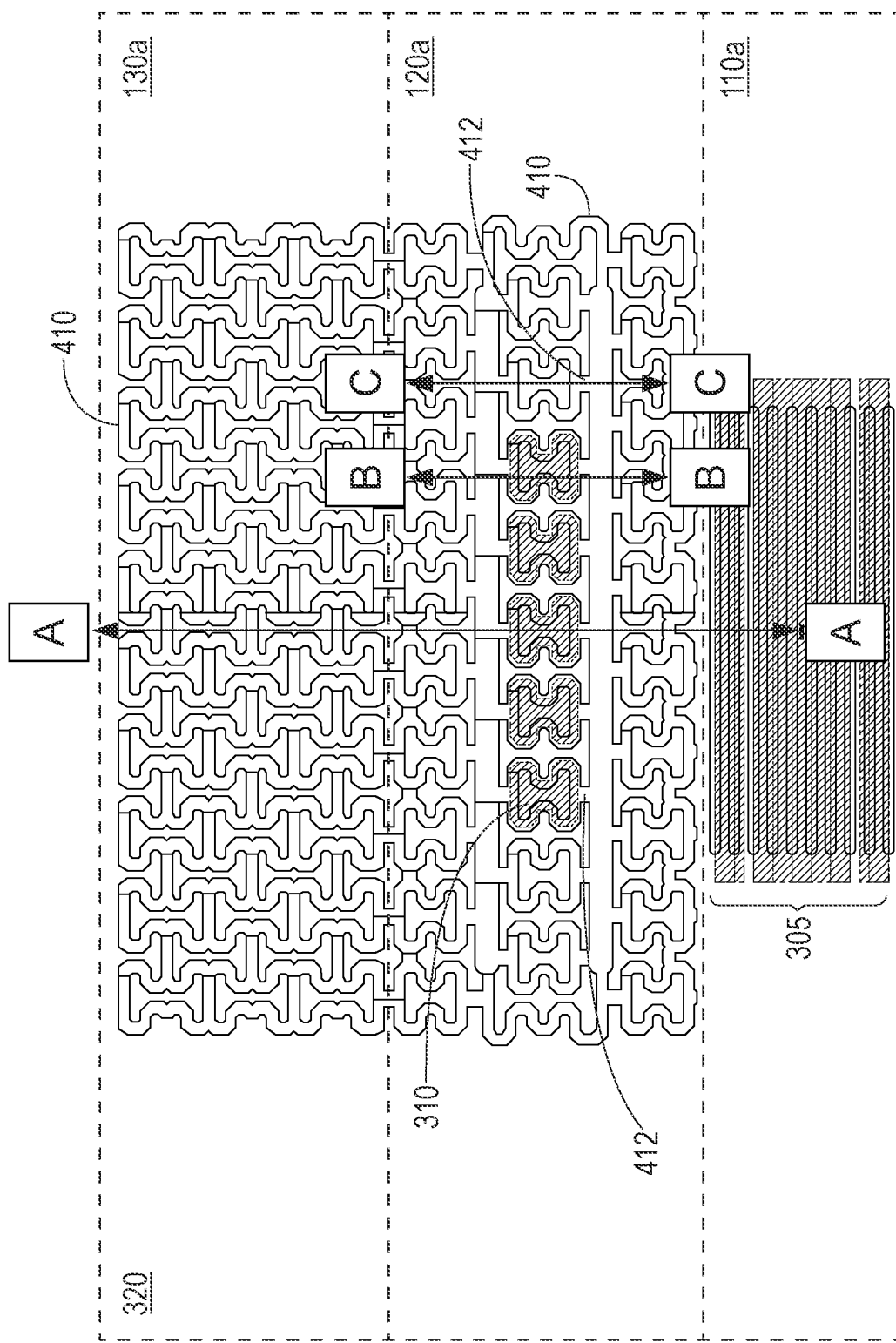

FIGS. 4A through 4D are diagrams illustrating formation of deep trenches 410a of the example semiconductor device. Referring to FIG. 4A, in addition to the pillar implant masking layers of FIG. 3A, a deep trench etch masking layer 410 is shown. The deep trench etch masking layer 410 indicates where portions of the semiconductor region 320 will be removed (e.g., using an anisotropic etch) for eventual formation a dielectric (oxide) film lattice in portion 120a and portion 130a. For instance, in this example, the dielectric film lattice can be defined, at least in part, on sidewalls of a deep trench (deep trenches 410a) formed using a photo lithography mask based on the deep trench etch masking layer 410. In FIG. 4A, a tab 412 (side tab, lateral support tab, etc.) is also indicated. In this example, such tabs can provide lateral support for dielectric films of the dielectric film lattice (e.g., vertical films extending into the page of FIG. 4A). Further, the tabs 412 can also provide access for an isotropic etch or etches (e.g., cavity etches) that are performed to remove semiconductor material (e.g., silicon and/or polysilicon) to produce cavities within the dielectric film lattice (which can operate as part of capacitor dielectrics in an associated passive component circuit. In this example, a trench etch mask (e.g., an oxide hard mask, which is etch selective with respect to silicon) can be formed using the mask based on the deep trench etch masking layer 410 (the deep trench mask) and the deep trenches 410a can be formed using an anisotropic silicon etch based on that trench etch mask, where the trench etch mask blocks areas that are not to etched.

Figure 4B:
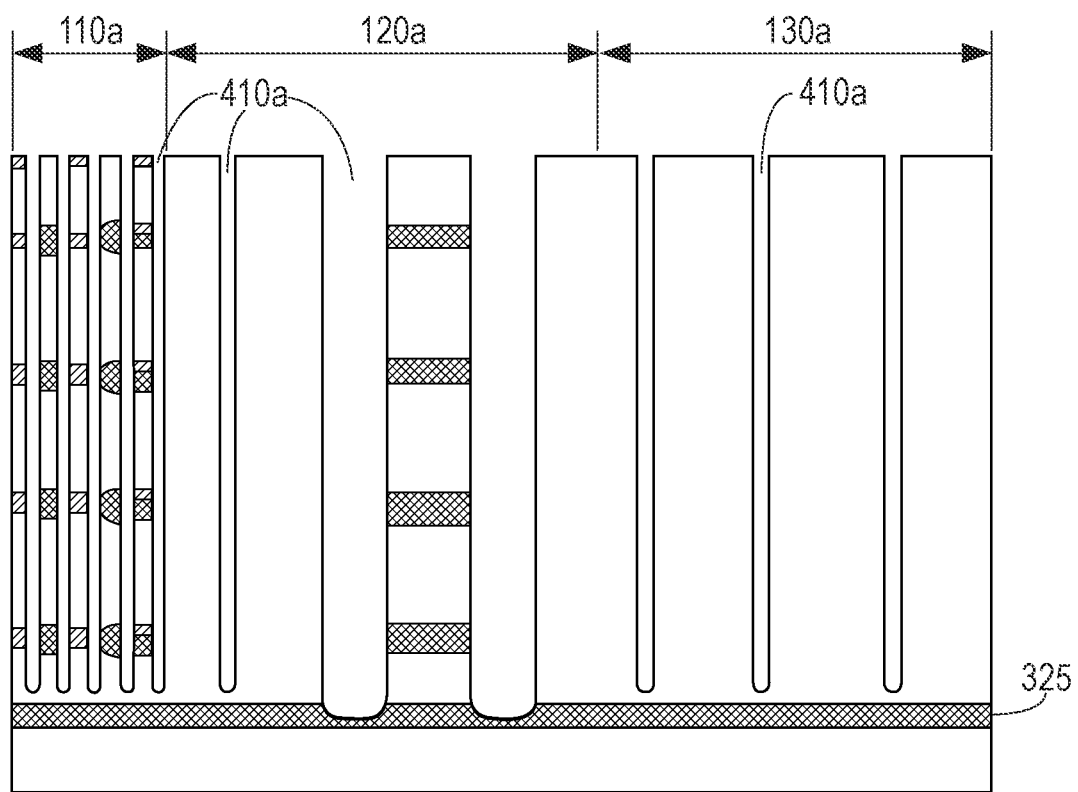
Figure 4C:
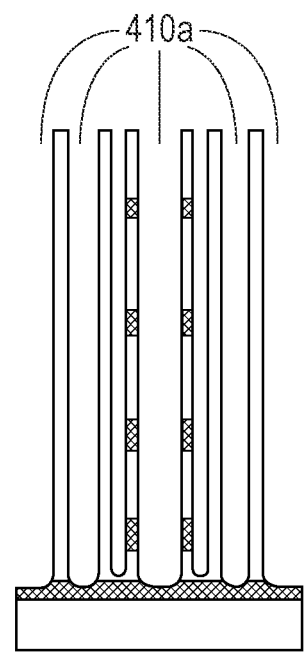
Figure 4D:
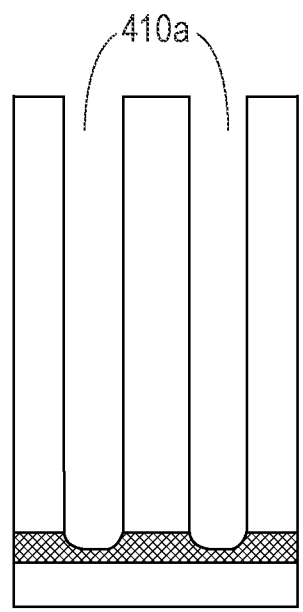

Referring to FIG. 4B, a cross-sectional view along the section line A-A in FIG. 4A is shown. In FIG. 4B, the deep trenches 410a formed using the deep trench etch masking layer 410 are shown. As illustrated in FIG. 4B, deep trenches 410a are formed in each of portion 110a, portion 120a and portion 130a. FIG. 4C illustrates a cross-sectional view along the section line B-B in FIG. 4A (e.g., in the portion 120a). As shown by a comparison of FIG. 4C with FIG. 4B, the pattern of trenches in FIG. 4C (due to the offset of the section line B-B from A-A on respective pillars 310) is different than the pattern of trenches in FIG. 4B (in portion 120a). In this example, this difference results from the respective pattern of the deep trench mask associated with those two sectionals views. FIG. 4D illustrates a cross-sectional view along line C-C in FIG. 4A, showing the trenches 410a for a section through a tab 412 without implants for the n-type pillars 310 of the example passive component circuit.

Figure 5A:
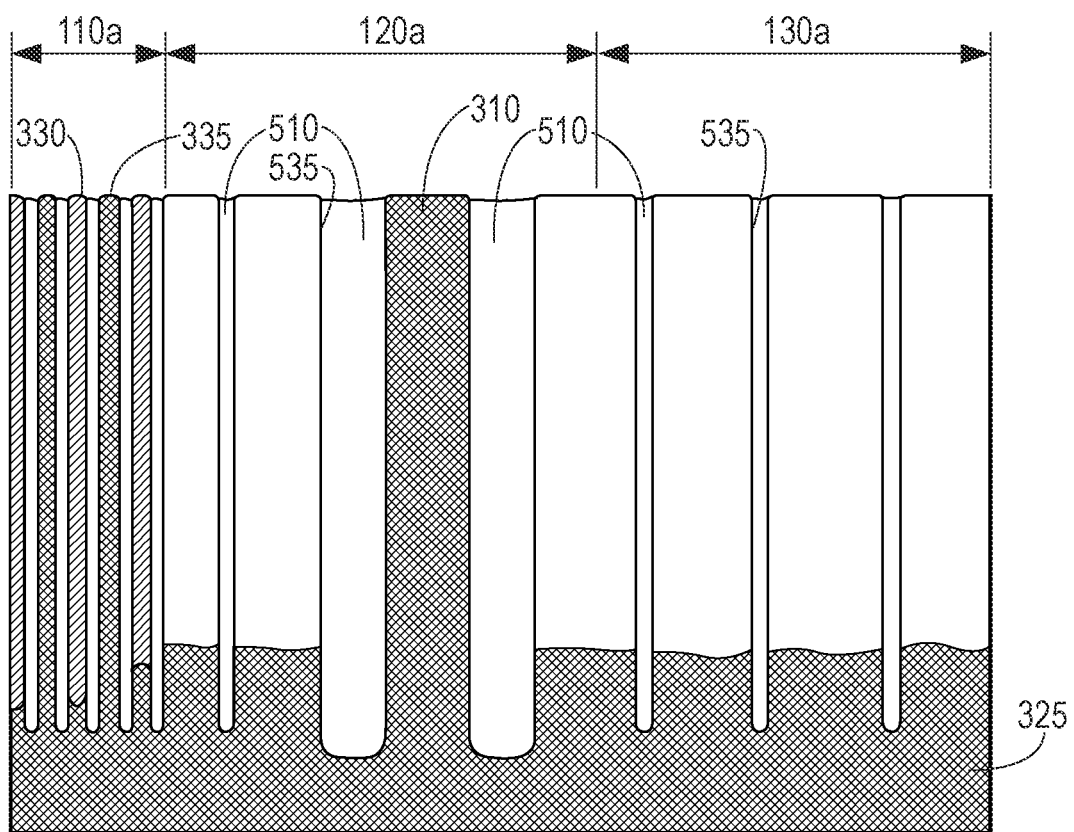
Figure 5B:
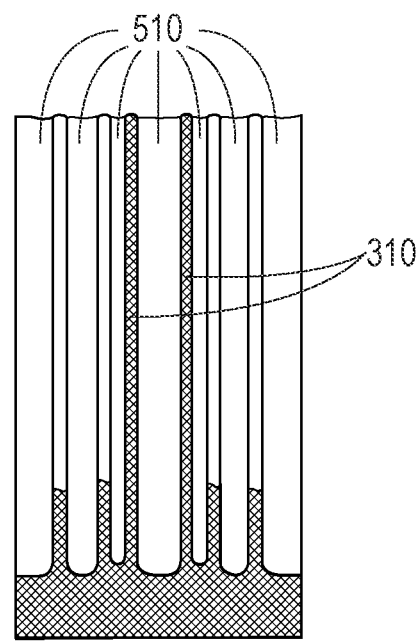
Figure 5C:
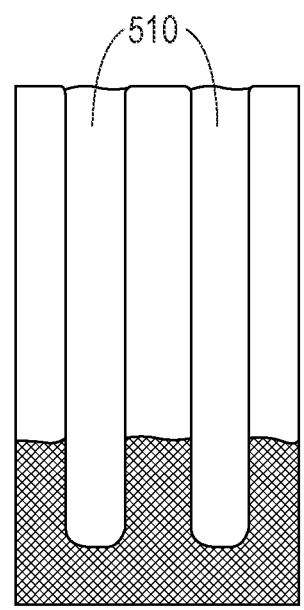

FIGS. 5A through 5C are diagrams illustrating operations for diffusion of pillars (e.g., pillars 310, 330 and 335) and polysilicon fill of the deep trenches of FIGS. 4A-4D of the example semiconductor device. In this example, there is not a masking layer associated with these processes. Accordingly, FIG. 5A-5C do not include a top down (layout) view for the semiconductor device being produced. FIG. 5A, is a cross-sectional view that corresponds with section line A-A (e.g., in FIGS. 3A and 4A). FIG. 5B corresponds with the section line B-B, and FIG. 5C corresponds with the section line C-C. These drawings, and their associated processing operations, will be discussed together.

The process operations corresponding with FIGS. 5A-5C can include an oxidation operation, which can protect the sidewalls of the deep trenches 410a during a high temperature pillar drive diffusion operation. The pillar diffusion operation can drive the implants for the n-type pillars 310, the n-type pillars 330 and the p-type pillars 335, as shown in FIGS. 5A and 5B. As shown in FIGS. 5A-5C, the pillar drive diffusion can also diffuse (drive, spread, etc.) the n-type buffer layer 325 of the semiconductor region 320 (from the implant in the initial epitaxial layer 340a of FIGS. 3A-3C). The processing operations of FIG. 5A-5C can then include an oxide etch to remove the protective oxide layer.

In this example, that oxide etch can be followed by operations to prepare sidewalls of the deep trenches for dielectric film 535 (e.g., oxide film) formation on sidewalls of the trench, where dielectric film 535 will be included in the dielectric film lattice of the corresponding semiconductor device. After formation of the dielectric film 535 on sidewalls of the deep trenches 410a of FIGS. 4A-4D, a polysilicon deposition and polish process can be formed to produce and planarize sacrificial polysilicon 510 in the deep trenches 410a that are lined with dielectric film 535.

As discussed in further detail below, the sacrificial polysilicon 510, as well as semiconductor material of the semiconductor region 320 can be subsequently removed (using cavity etches) to define a dielectric film lattice in the portion 120a and the portion 130a of the passive component region 120 and the termination region 130 in this example. As also discussed further below, dielectric film 535 lining included in the deep trenches 410a (in addition to being included in a dielectric lattice produced in this example) can also act an etch stop layer when forming (etching) the cavities to define the dielectric lattice including the dielectric film 535.

Figure 6A:
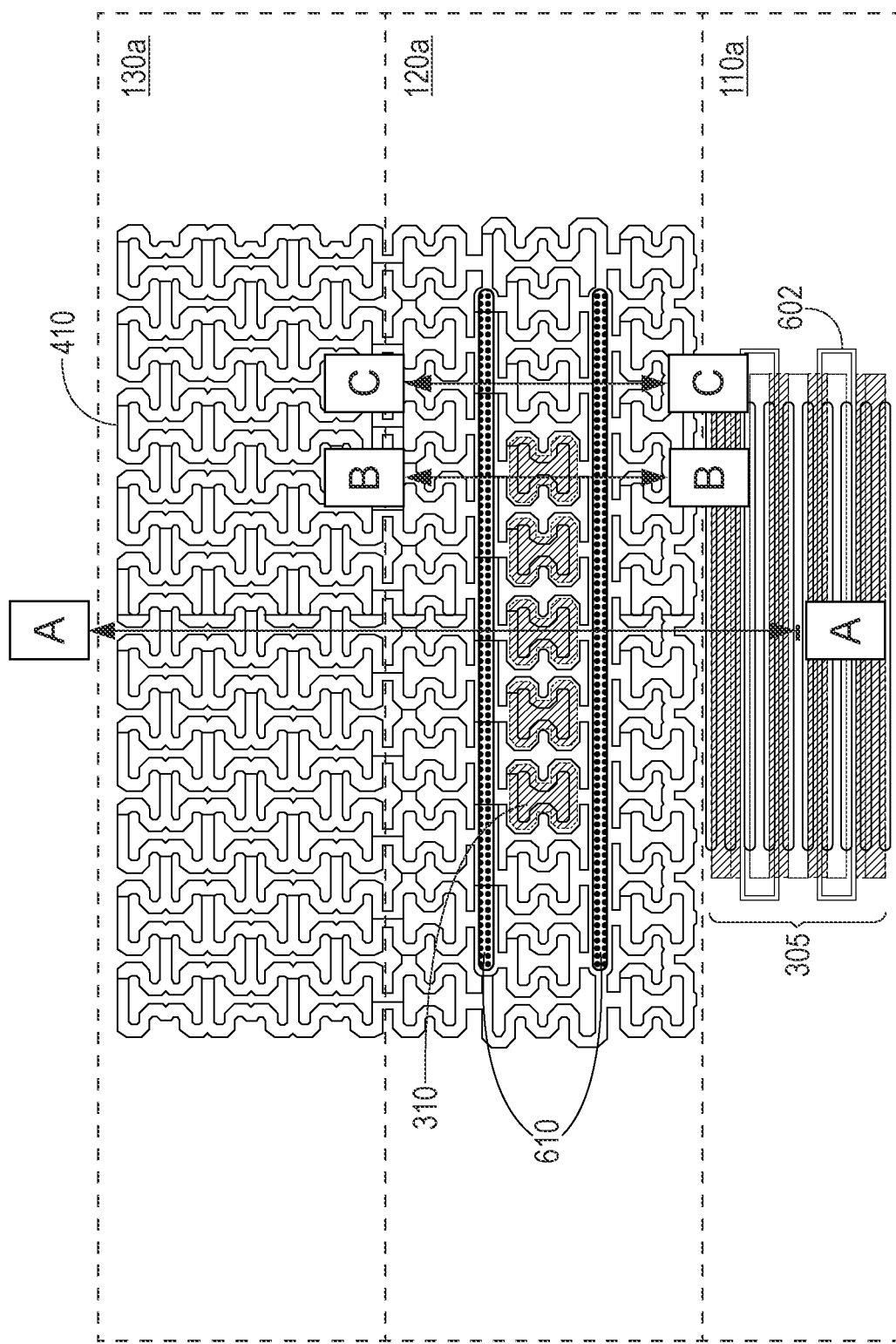
Figure 6B:
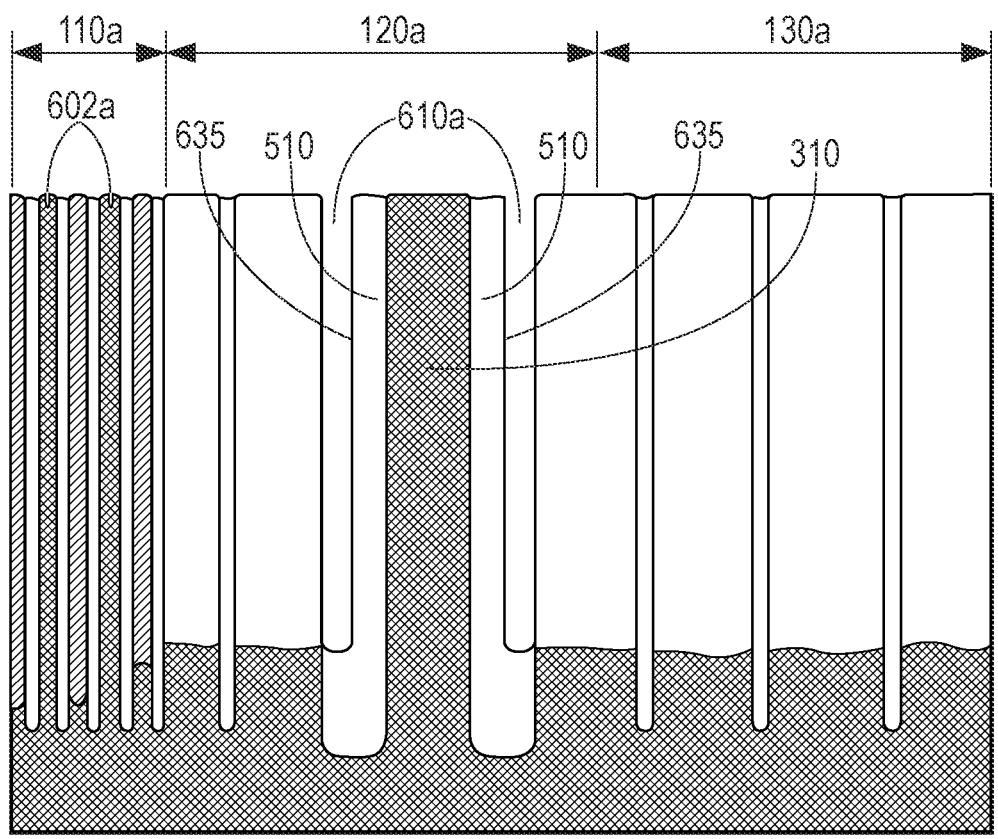
Figure 6C:
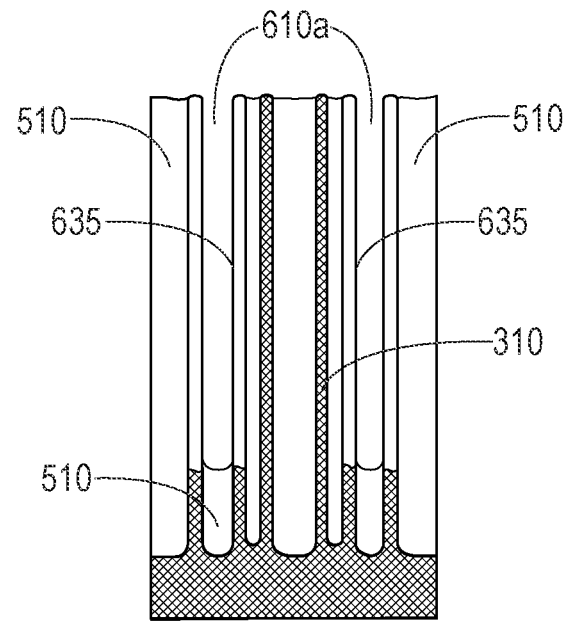

FIGS. 6A through 6D are diagrams illustrating formation of transistor gate trenches and trenches for the dielectric lattice implemented structures of the example semiconductor device. FIG. 6A is a top-down, layout view. FIG. 6B is a cross-sectional view that corresponds with section line A-A of FIG. 6A. FIG. 6C is a cross-sectional view that corresponds with the section line B-B in FIG. 6A, and FIG. 6D corresponds with the section line C-C in FIG. 6A. These drawings, and their associated processing operations, will be discussed together.

Figure 6D:
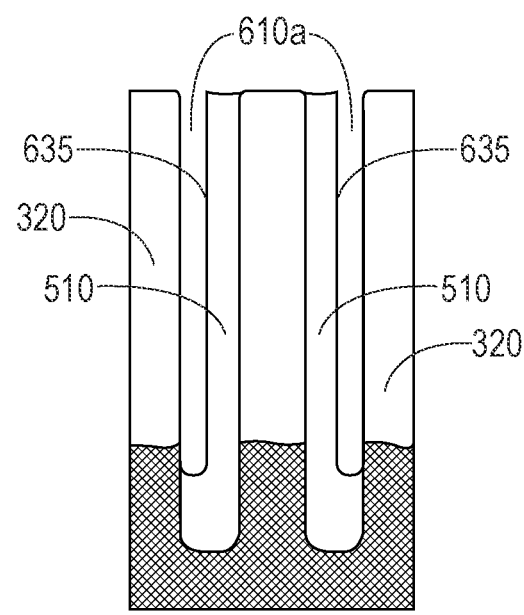

Referring to FIG. 6A, in addition to the masking layers of the previous figures, a gate trench masking layer 602 and a passive component trench masking layer 610 are shown. For instance, a mask (gate trench mask) based on the gate trench masking layer 602 can be used, as shown in FIG. 6B, to define and produce (etch) gate trenches 602a for the MOSFET 305 in the portion 110a (e.g., of the active region 110). As shown in FIGS. 6B-6D, a mask (passive component trench mask) based on the passive component trench masking layer 610 can be used to produce (etch) trenches 610a for the trench-implemented passive device of the passive component circuit of this example. As shown in FIG. 6B, the gate trenches 602a are, as compared to the trenches 610a, extremely shallow. In some implementations, forming the trenches 610a can include performing an anisotropic polysilicon etch in combination with an isotropic etch (e.g., to undercut a hard mask used to define the trenches 610a).

After formation of the gate trenches 602a and the trenches 610a, the processing operations of FIGS. 6A-6D can include formation of gate oxide in the gate trenches 602a (not indicated in FIG. 6B) and formation of dielectric film 635 (e.g., an oxide liner) in the trenches 610a, where the dielectric film 635 can be included in a dielectric film lattice, such as those described herein. That is, the dielectric film 635 can define (in combination with the dielectric film 535) the suspended trench of a passive component circuit, such as discussed above with respect to, at least, FIG. 2. Also, as with the dielectric film 535, the dielectric film 635 can, in addition to defining the dielectric linings of the trenches 610a (for suspended trenches), can also act as an etch stop layer during etch operations (cavity etch operations) used to removing sacrificial polysilicon 510 and silicon of the semiconductor region 320, e.g., to define cavities with the corresponding dielectric film lattice.

As shown by a comparison of FIGS. 6C and 6D with FIG. 6B, the pattern of trenches, sacrificial polysilicon 510, the n-type pillars 310, and semiconductor material of the semiconductor region 320 in FIG. 6C, due to the offset of the section line B-B from A-A on respective pillars 310) is different than the pattern of FIG. 6B (in portion 120a). In this example, this difference results from the respective pattern of the deep trench mask associated with those two sectionals views. As noted above, FIG. 6D illustrates a cross-sectional view along line C-C in FIG. 6A, showing the trenches 610a for a cross-section through a tab 412 (as shown in FIG. 4A) without implants for the n-type pillars 310 of the example passive component circuit.

Figure 7B:
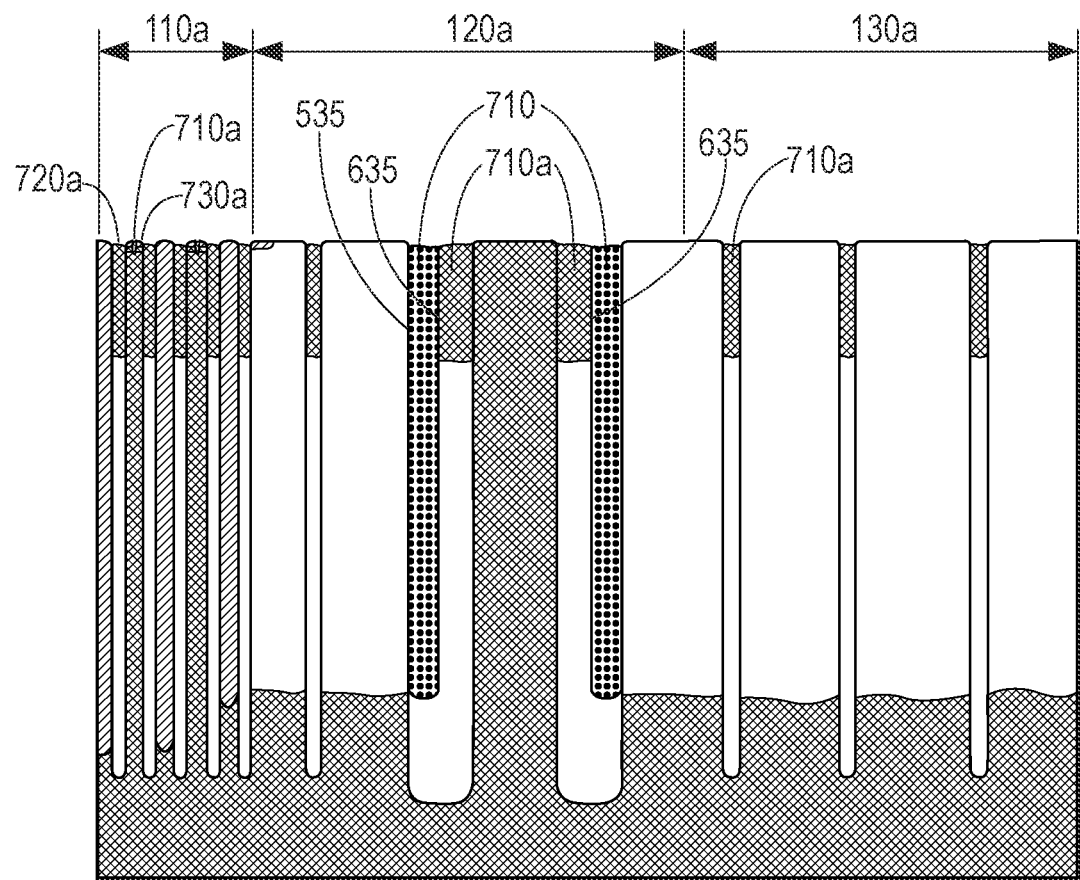
Figure 7C:
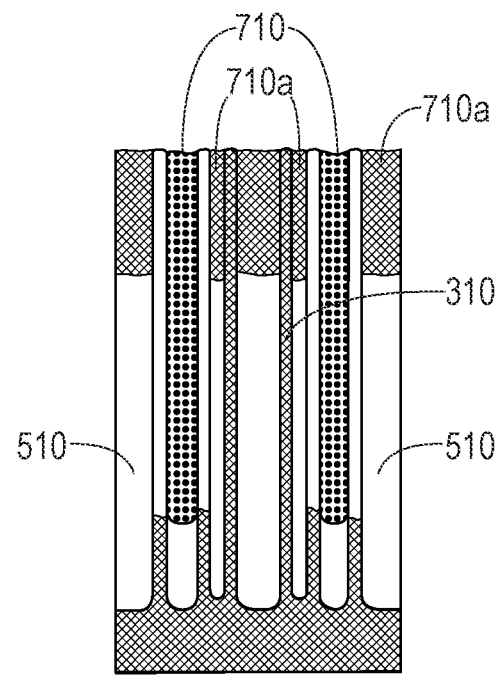
Figure 7D:
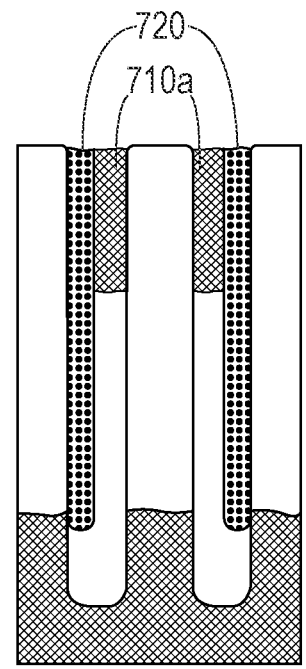

FIGS. 7A through 7D are diagrams illustrating doped polysilicon fill of the gate trenches 602a and the trenches 610a, as well as formation of well regions and source implants of the example semiconductor device. FIG. 7A is a top-down, layout view. FIG. 7B is a cross-sectional view that corresponds with section line A-A of FIG. 7A. FIG. 7C is a cross-sectional view that corresponds with the section line B-B in FIG. 7A, and FIG. 7D corresponds with the section line C-C in FIG. 7A. These drawings, and their associated processing operations, will be discussed together.

The operations associated with doped polysilicon fill of the gate trenches 602a and the trenches 610a (where the trenches 610a are defined by the dielectric film 535 and the dielectric film 635) can be performed without an additional masking layer. Accordingly, a corresponding making layer is not shown. That is, in some implementations, doped (n-type) polysilicon 710 and 710a can be deposited to respectively fill the trenches 610a and the 602a. For instance, a single doped polysilicon (or other conductive material) deposition (to fill the gate trenches 602a and the trenches 610a) can be performed, and then a polishing operation (e.g., chemical mechanical polishing) can be performed to both planarize and remove the doped polysilicon from an upper surface of the semiconductor device being produced. As shown in FIG. 7B, these processes can produce doped polysilicon 710 (e.g., conductive plates in the trenches 610a) and doped polysilicon 710a (e.g., gate electrodes in the gate trenches 602a). As shown in FIGS. 7B-7C, the process of doped polysilicon deposition can also result in doped portions 710a (e.g., upper portions) of the sacrificial polysilicon 510 disposed in the deep trenches of FIGS. 4A-4D.

Referring to FIG. 7A, in addition to the masking layers of the previous figures, a p-well masking layer 720 and a n-source making layer 730 are shown. For instance, a mask (p-well mask) based on the p-well masking layer 720 can be used, as shown in FIG. 7B, to define and produce a p-well 720a (e.g., body region) for the MOSFET 305. As also shown in FIG. 7B, a mask (n-source mask) based on the n-source making layer 730 can be used, as shown in FIG. 7B, to define and produce a n-type source regions 730a for the MOSFET 305. In addition, in some implementations, the n-source masking layer 730 can be used to enhance the surface doping in the n-type pillars 310. The p-well 720a and the n-type source regions 730a can be formed by respective implant operations.

Similar to FIGS. 6C and 6D, FIGS. 7C and 7D, as compared to FIG. 7B, show differences in arrangement of the various elements of the sectional views of section lines A-A, B-B and C-C. That is, differences between the pattern of trenches, sacrificial polysilicon 510, upper doped polysilicon 710a, the n-type pillars 310, and semiconductor material of the semiconductor region 320, due to the offset of the section line B-B from the section line A-A on respective pillars 310, are apparent from this comparison.

Figure 8A:
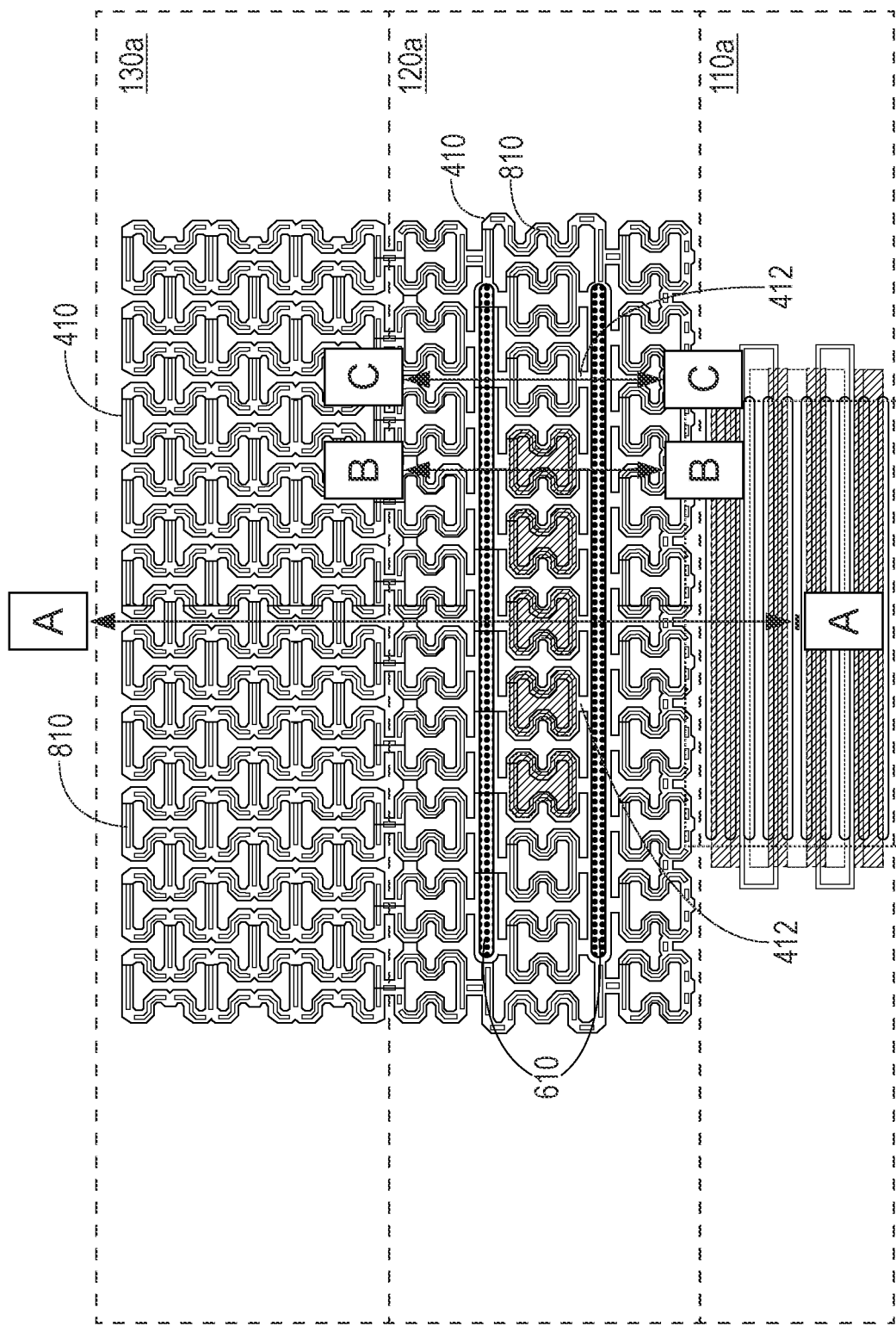
Figure 8B:
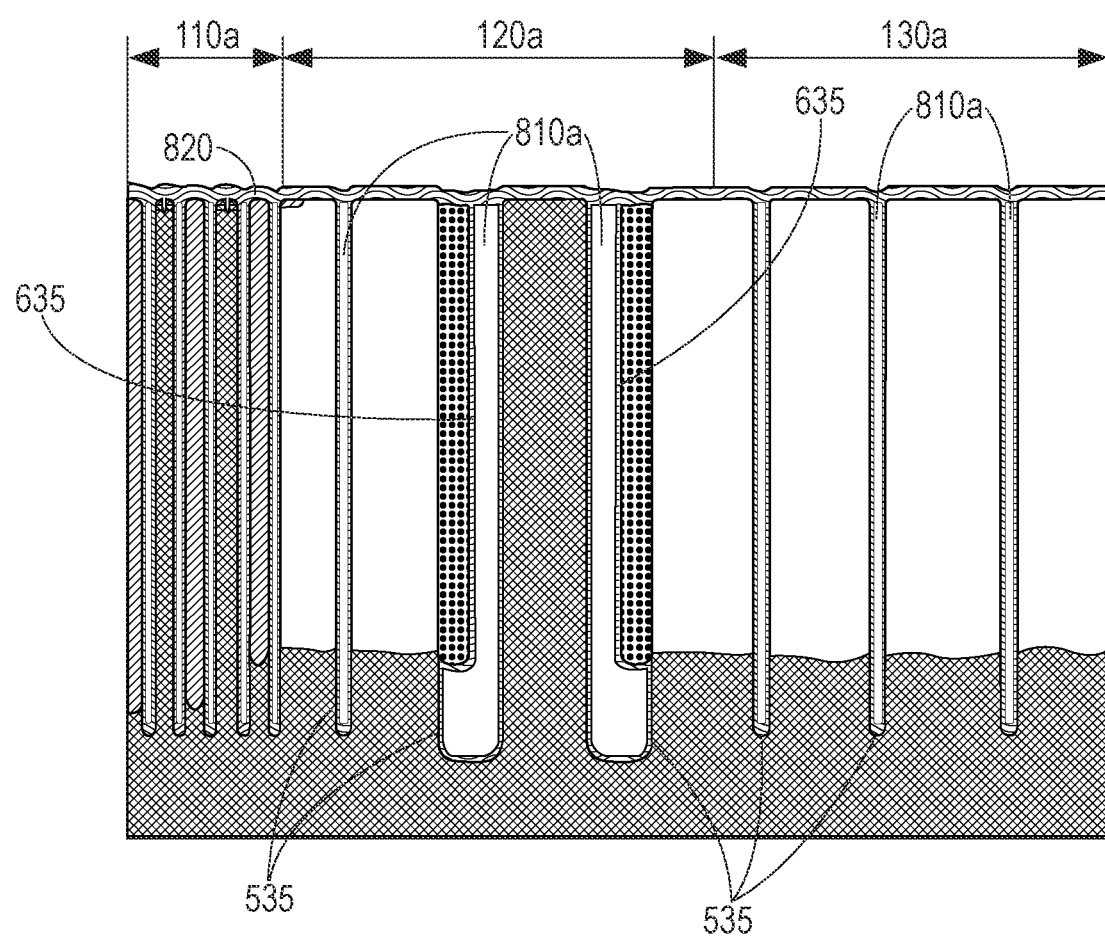
Figure 8C:
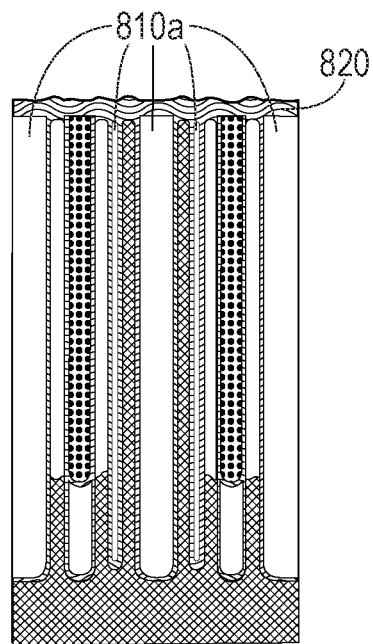

FIGS. 8A through 8D are diagrams illustrating formation of first cavities of the oxide lattice implemented trench structures of the example semiconductor device. FIG. 8A is a top down layout view. FIG. 8B is a cross-sectional view that corresponds with section line A-A of FIG. 8A. FIG. 8C is a cross-sectional view that corresponds with the section line B-B in FIG. 8A, and FIG. 8D corresponds with the section line C-C in FIG. 8A. These drawings, and their associated processing operations, will be discussed together.

Referring to FIG. 8A, in addition to the masking layers of the previous figures, a first cavity etch masking layer 810 is shown. As shown in FIG. 8A, the first cavity etch masking layer 810 defines a pattern (e.g., a segmented pattern) within the deep trench etch masking layer 410 of FIG. 4A. In this example, a mask (first cavity mask) based on the first cavity etch masking layer 810 can be used, as shown by the resulting structure of FIGS. 8B, 8C, 8D, to define and produce an etch mask (e.g., a hard mask) for forming first cavities 810a of a dielectric film lattice (including the dielectric film 535 and the dielectric film 635).

Figure 8D:
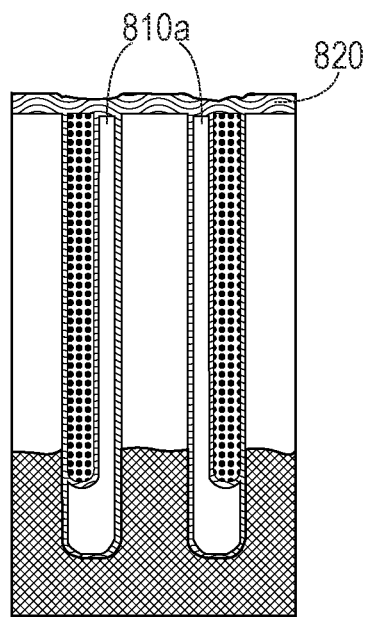

For instance, in this example, the first cavity etch can remove remaining sacrificial polysilicon 510 from the active region 110, the passive component region 120 and the termination region 130 (as shown by first cavities 810a in FIGS. 8B-8D). That is, the first cavity mask can define a patterned etch mask. After forming the patterned etch mask (e.g., based on the first cavity etch masking layer 810) an isotropic etch (e.g., an etch that is aggressive to silicon and selective to oxide) can be performed to form (define, etch, etc.) the first cavities 810a of a dielectric film lattice (including the dielectric film 535 and the dielectric film 635).

As shown in FIGS. 8B and 8D, because an isotopic etch is used to form the first cavities 810a, that etch can also remove sacrificial polysilicon 510 that is disposed under the conductive material filled suspended trenches (e.g., via the tabs 412). Further, in this example, by using an isotropic etch that is highly selective between silicon and dielectric (e.g., oxide), the dielectric film 535 and the dielectric film 635, in addition being included in the dielectric film lattice, can also act as an etch stop for the isotropic first cavity etch. That is, in this example, the dielectric film 535 and the dielectric film 635 are not etched, or are insignificantly etched.

After formation of the first cavities 810a, the first cavity etch hard mask can be removed and a dielectric (e.g., glass) cap layer 820 can be formed and planarized (e.g., using a reflow process). As shown in FIGS. 8B-8D, the cap layer 820 can extend over the portion 110a, the portion 120a and portion 130a.

Similar to FIGS. 6C-6D and 7C-7D, FIGS. 8C and 8D, as compared to FIG. 8B, show differences in arrangement of the various elements of the sectional views of section lines A-A, B-B and C-C. That is, differences between the pattern of trenches, first cavities 810a, and other elements of the example semiconductor, due to the offset of the section line B-B from the section line A-A on respective pillars 310, are apparent from this comparison.

Figure 9A:
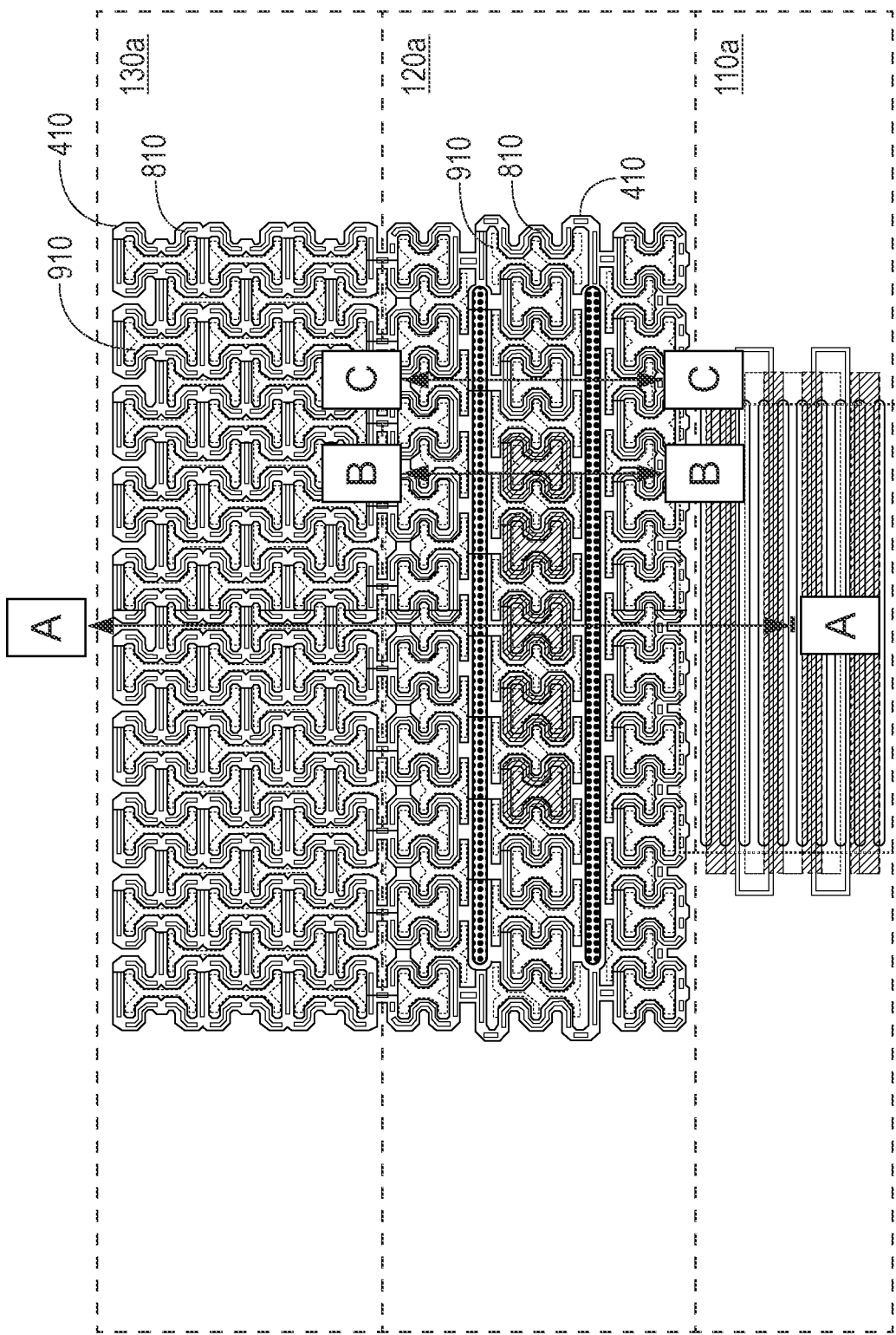
Figure 9B:
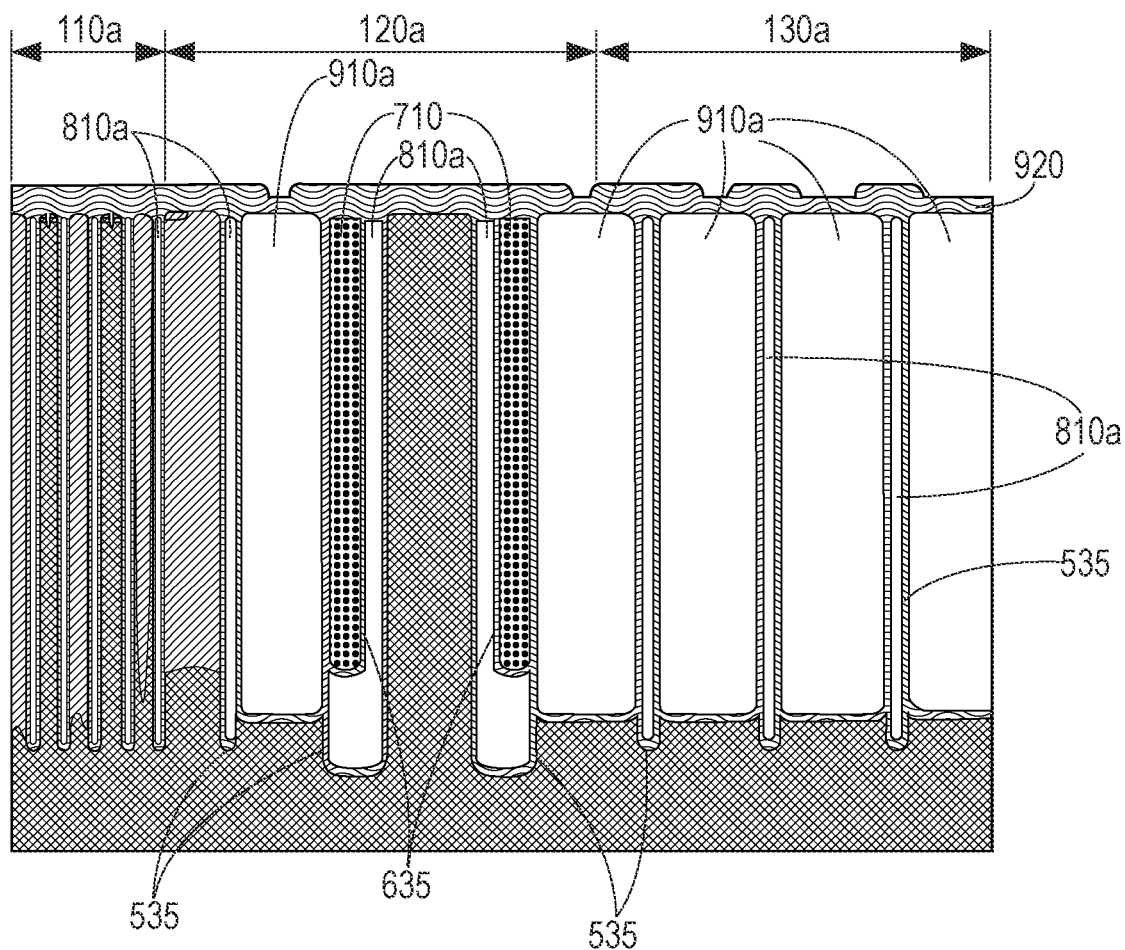
Figure 9C:
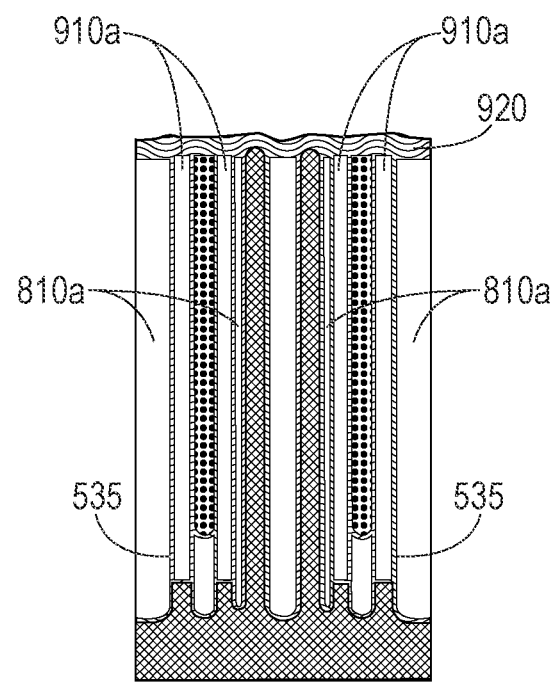

FIGS. 9A through 9D are diagrams illustrating formation of second cavities of the oxide lattice implemented trench structures of the example semiconductor device. FIG. 9A is a top down layout view. FIG. 9B is a cross-sectional view that corresponds with section line A-A of FIG. 9A. FIG. 9C is a cross-sectional view that corresponds with the section line B-B in FIG. 9A, and FIG. 9D corresponds with the section line C-C in FIG. 9A. These drawings, and their associated processing operations, will be discussed together.

Referring to FIG. 9A, in addition to the masking layers of the previous figures, a second cavity etch masking layer 910 is shown. As shown in FIG. 9A, the second cavity etch masking layer 910 defines a pattern (e.g., a segmented pattern) between the pattern of the deep trench etch masking layer 410 of FIG. 4A. In this example, a mask (second cavity mask) based on the second cavity etch masking layer 910 can be used, as shown by the resulting structure of FIGS. 9B-9D, to define and produce an etch mask (e.g., a hard mask) for forming second cavities 910a of a dielectric film lattice (including the dielectric film 535, the dielectric film 635 and first cavities 810a).

Figure 9D:
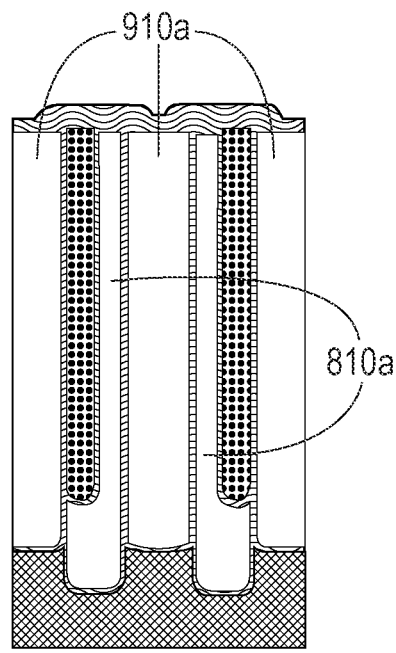

For instance, in this example, the second cavity etch can remove remaining semiconductor material (epitaxial material) of the semiconductor region 320 (e.g., as described with respect to FIGS. 3A-3C) from the passive component region 120 and the termination region 130 (as shown by second cavities 910a in FIGS. 9B-9D). That is, the second cavity mask can define a patterned etch mask. After forming the patterned etch mask (e.g., based on the second cavity etch masking layer 910) an isotropic etch (e.g., an etch that is aggressive to silicon and selective to oxide) can be performed to form (define, etch, etc.) the second cavities 910a of a dielectric film lattice (including the dielectric film 535, the dielectric film 635, and the cavities 810a).

In this example, as with the first cavity etch of FIGS. 8A-8D, by using an isotropic etch that is highly selective between silicon and dielectric (e.g., oxide), the dielectric film 535, in addition being included in the dielectric film lattice, can also act as an etch stop for the isotropic second cavity etch. That is, in this example, the dielectric film 535 is not etched when forming the second cavities 910a, or is insignificantly etched. In this example, the dielectric film 635 of the suspended trenches may not be exposed to the isotropic etch of the second cavity etch.

After formation of the second cavities 910a, as with the first cavity etch, the second cavity etch hard mask can be removed and a dielectric (e.g., glass) cap layer 920 can be formed and planarized (e.g., using a reflow process). As shown in FIGS. 9B-9D, the cap layer 920 can extend over the portion 110a, the portion 120a and portion 130a. In this example, the cap layer 920 can act as inter-layer dielectric between underlying semiconductor features and metal layers (such as illustrated in FIGS. 11A-11D) of the semiconductor device being produced in this example.

Similar to FIGS. 6C-6D, 7C-7D and 8C-8D, FIGS. 9C and 9D, as compared to FIG. 9B, show differences in arrangement of the various elements of the sectional views of section lines A-A, B-B and C-C. That is, differences between the pattern of trenches, first cavities 810a, second cavities 910a, and other elements of the example semiconductor device, due to the offset of the section line B-B from the section line A-A on respective pillars 310, are apparent from this comparison.

Figure 10:
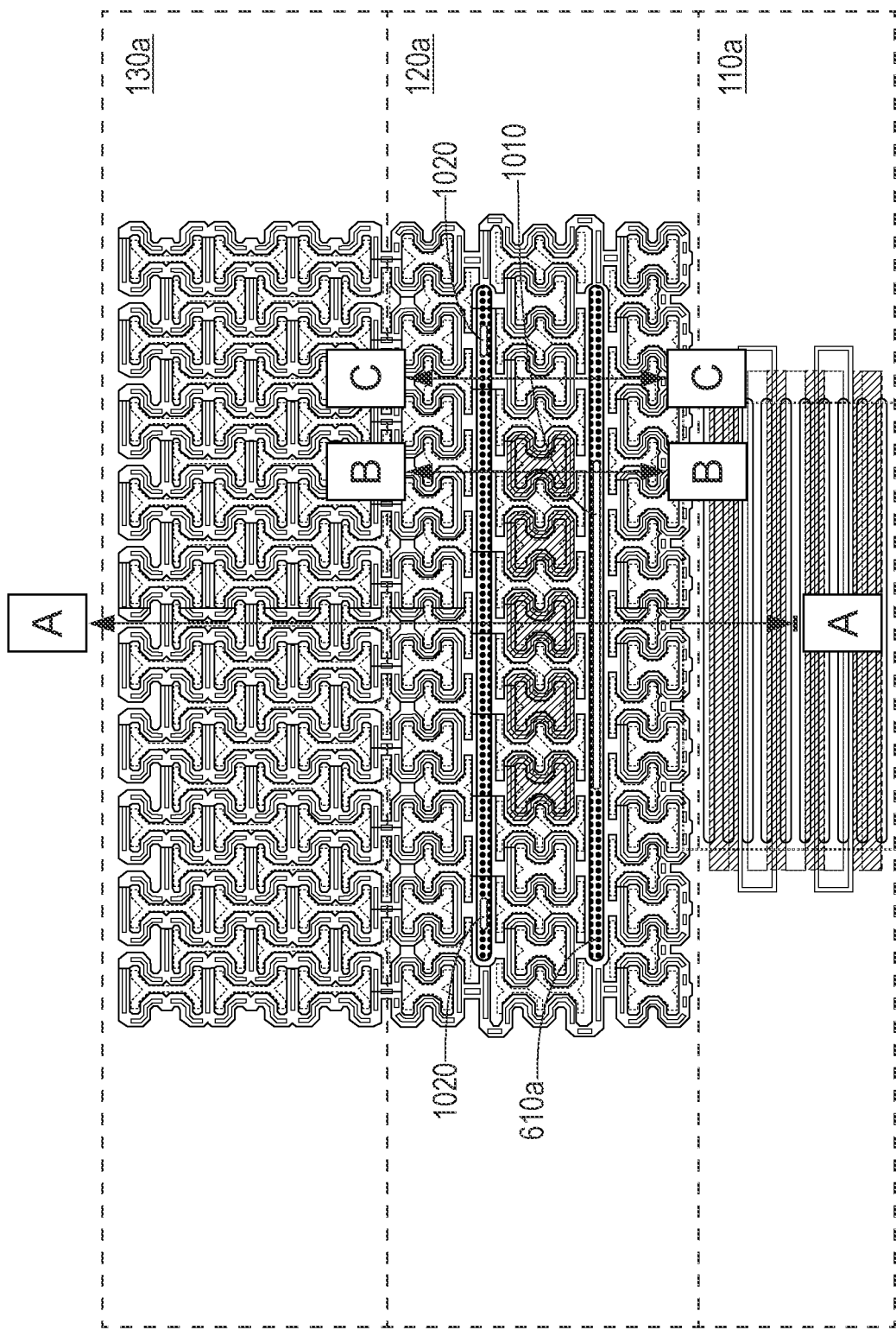

FIG. 10 is a diagram illustrating formation of contacts of the example semiconductor device being produced. In FIG. 10, in addition to the masking layers of the previous figures, a contact masking layer is shown that includes masking patterns for contacts (e.g., ohmic contacts) 1010 and 1020. In this example, the contact 1010 is a contact to source metal that is also electrically coupled to a source terminal of the MOSFET 305. Further in this example, the contacts 1020 are contacts to gate metal that is also electrically coupled to a gate terminal of the MOSFET 305. That is, the contacts 1010 and 1020 can be ohmic contact from metal layers (e.g., as discussed below with respect to FIGS. 11A-11D) to the conductive material 710 in the passive component trenches 610a (e.g., the suspended trenches). While not specifically referenced in FIG. 10, the contact masking layer of FIG. 10 can also be used for forming (patterning, etc.) ohmic contacts from source metal to source and body regions of the MOSFET 305.

Figure 11A:
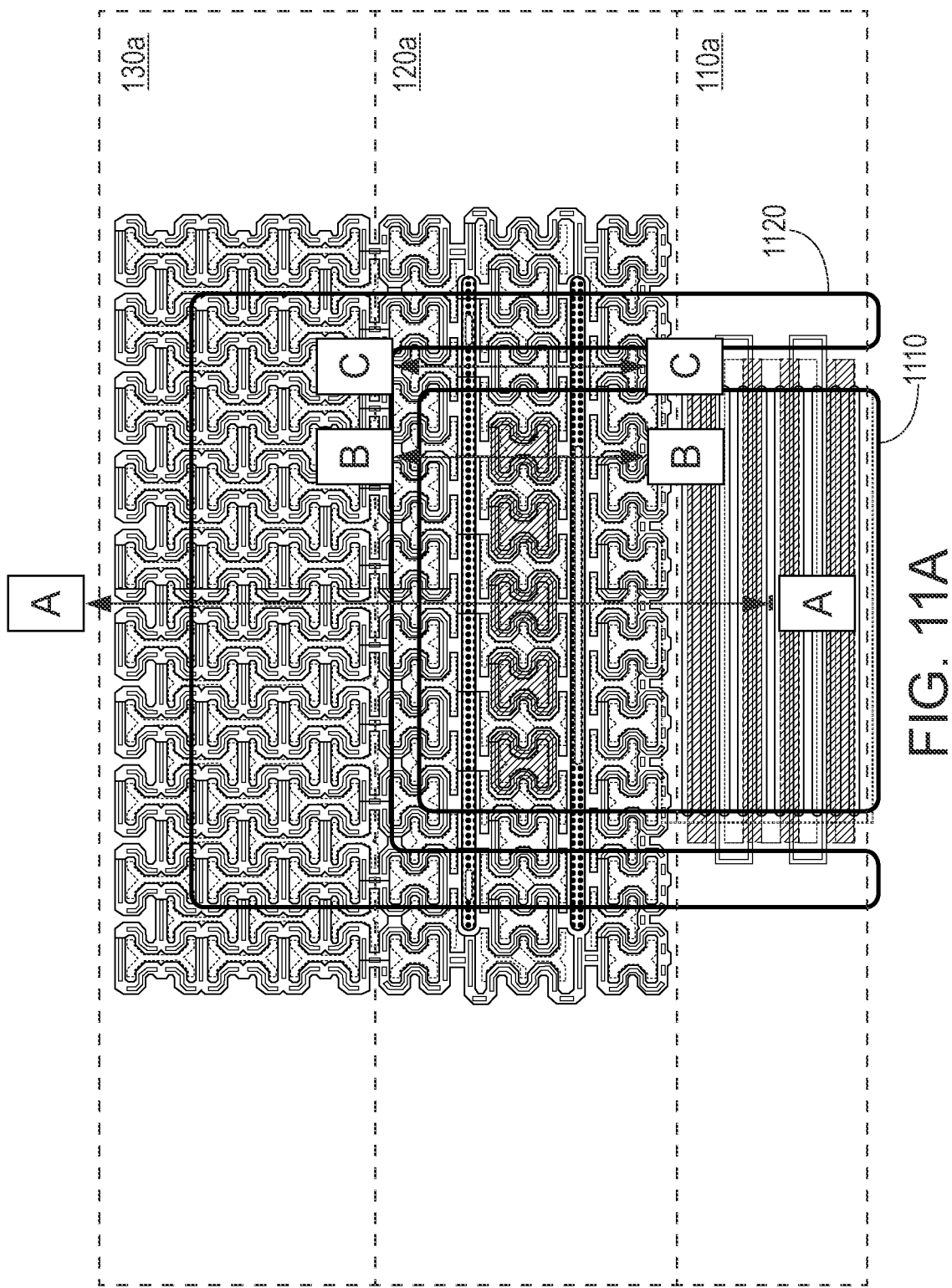
Figure 11B:
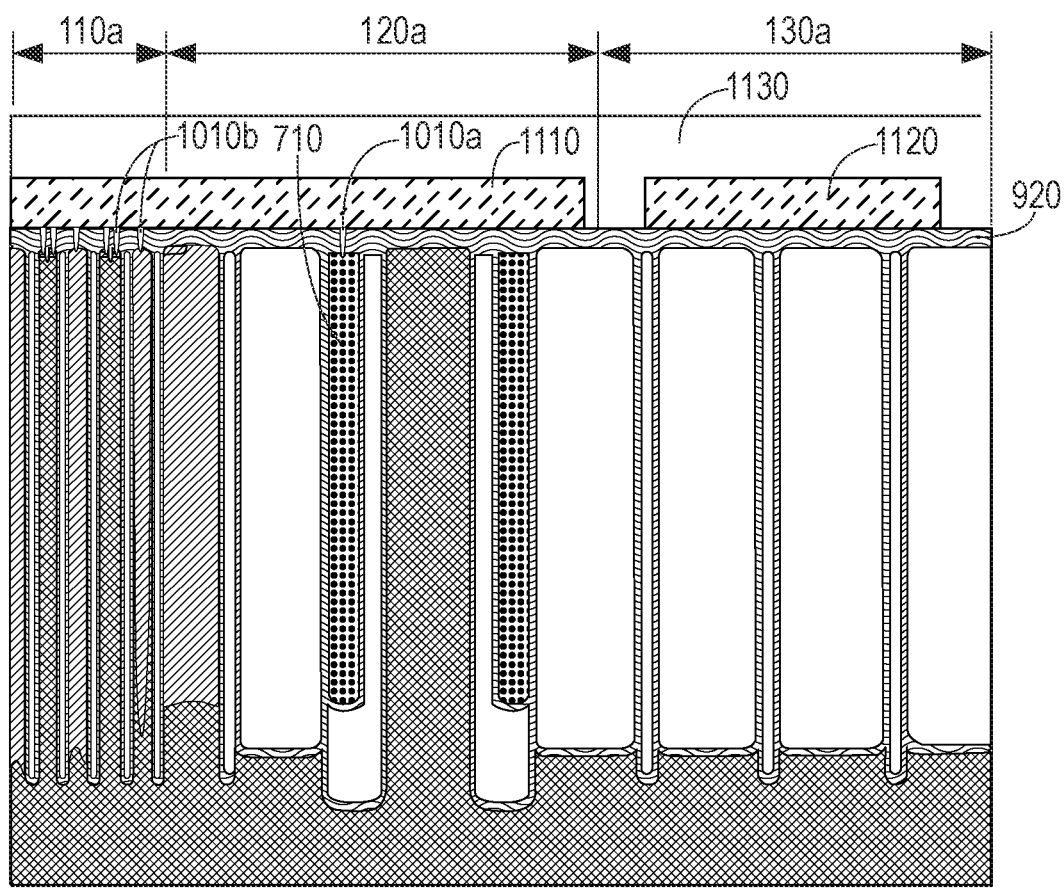
Figure 11C:
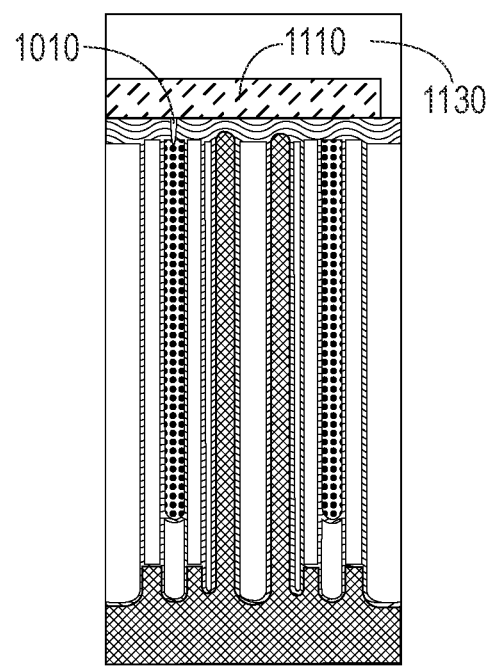

FIGS. 11A through 11D are diagrams illustrating formation of metal and passivation layers of the example semiconductor device. FIG. 11A is a top down layout view. FIG. 11B is a cross-sectional view that corresponds with section line A-A of FIG. 11A. FIG. 11C is a cross-sectional view that corresponds with the section line B-B in FIG. 11A, and FIG. 11D corresponds with the section line C-C in FIG. 11A. These drawings, and their associated processing operations, will be discussed together.

Referring to FIG. 11A, in addition to the masking layers of the previous figures, a metal masking layer is shown that defines metal patterns for source metal 1110 (electrically coupled with a source terminal of the MOSFET 305) and gate metal 1120 (electrically coupled with a gate terminal of the MOSFET 305). In this example, a mask (metal mask) based on the metal masking layer can be used, as shown by the resulting structure of FIGS. 11B-11D, to define and produce an etch mask for patterning source metal 1110 and gate metal 1120 (e.g., from a blanket metal layer).

Figure 11D:
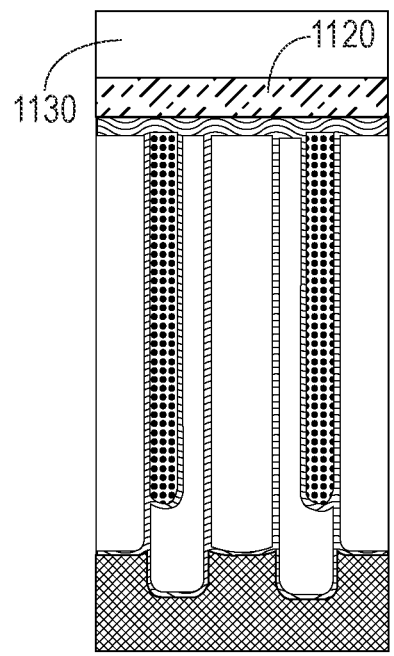

Referring to FIGS. 11B-11D, source metal 1110 and gate metal 1120 corresponding with the metal masking layer of FIG. 11A are illustrated. FIGS. 11B and 11C also show an ohmic contact 1010a to the conductive material 710, where the contact 1010a corresponds with the contact pattern 1010 of the contact masking layer in FIG. 10. As can be seen from 11A, an ohmic contact corresponding with the contact pattern 1020 is not shown in the cross-sections of FIGS. 11B-11C (e.g., is not intersected by any of the section lines A-A, B-B or C-C. FIG. 11B also illustrates body/source contact 1010b for the MOSFET 305. As indicated above, the masking pattern for the source contact 1010b is not specifically shown in FIG. 10. FIGS. 11B-11C also illustrate a passivation layer 1130 that is disposed on the source metal 1110, the gate metal 1120, and the cap layer 920.

FIGS. 12A-12G are diagrams illustrating layout views of various implementations of oxide lattice implemented trench structures in a passive component circuit. For purposes of clarity, and by way of example, examples of FIGS. 12A-12G are based on the example structure, and illustrated using similar layout views, and the example semiconductor device discussed with respect to the process illustrated in FIGS. 3A-11D. In each of FIGS. 12A-12G, portions 110a, 120a and 130 (consistent with those discussed above) are indicated. Further, elements from other figures are indicated for context and by way of reference. For instance, the MOSFET 305, pillars 310, source metal 1110, and gate metal 1120 may be indicated in the FIGS. 12A-12G. Also, for purposes of illustration, other elements of the FIGS. 3A-11D may be further referenced with respect to the discussion of FIGS. 12A-12G.

Figure 12A:
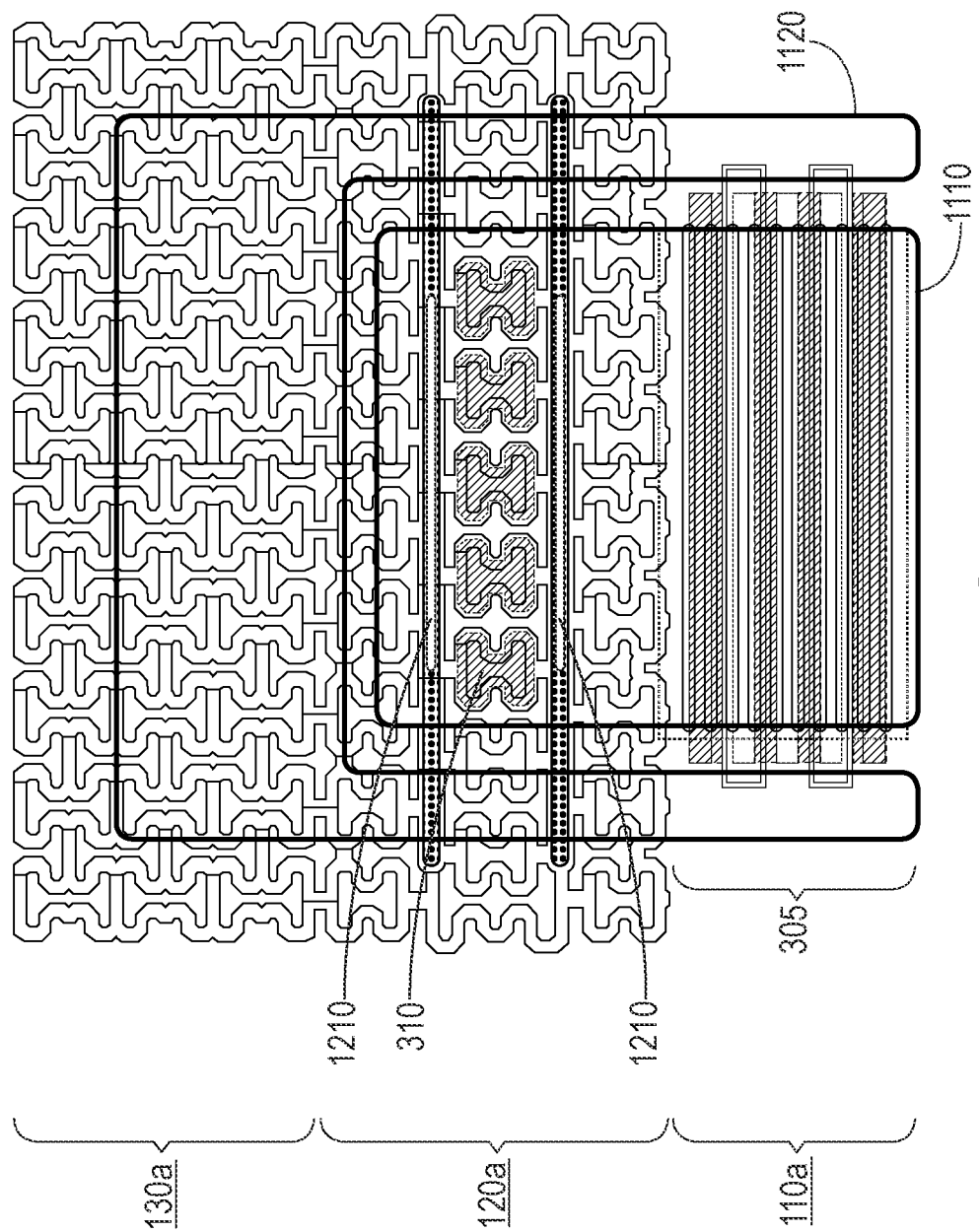

As shown in FIG. 12A, two contacts 1210 to source metal 1110 are shown. In this arrangement, the illustrated passive component circuit would be configured to implement two source to drain capacitors for the MOSFET 305. In this arrangement, the conductive material 710 in each of the trenches 610a would define (act as, etc.) respective top plates of those capacitors, while the pillars 310 (which can be electrically coupled with a drain terminal of the MOSFET 305) would define (act as, etc.) a common (shared) bottom plate of both capacitors. As discussed herein, the first cavities 810a, the second cavities 910a, in combination with the dielectric film 535 and the dielectric film 635 can define (act as, etc.) the respective dielectrics of those capacitors (as well as other capacitor configurations described herein, such as with respect to FIGS. 12B-12E.

Figure 12B:
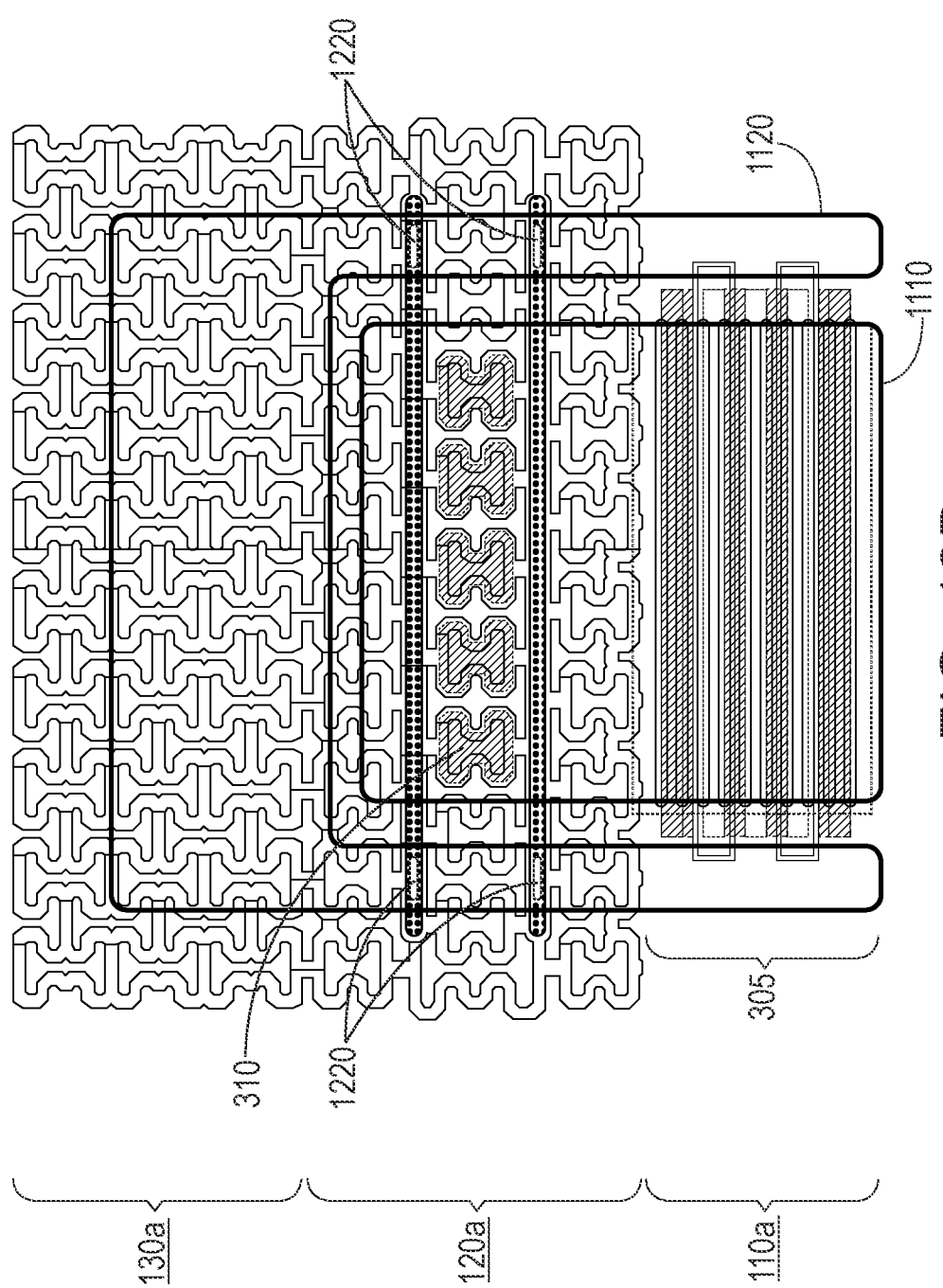

Referring to FIG. 12B, four ohmic contacts 1220 from the gate metal 1120 to the conductive material 710 of the trenches 610a are illustrated (two for each trench 610a). In this arrangement, the illustrated passive component circuit would be configured to implement two gate to drain capacitors for the MOSFET 305. In this arrangement, the conductive material 710 in each of the trenches 610a would define (act as, etc.) respective top plates of those capacitors, while the pillars 310 (which can be electrically coupled with a drain terminal of the MOSFET 305) would define (act as, etc.) a common (shared) bottom plate of both capacitors. As discussed herein, the first cavities 810a, the second cavities 910a, in combination with the dielectric film 535 and the dielectric film 635 can define (act as, etc.) the respective dielectrics of those capacitors.

Referring to FIG. 12C, a contact 1210 from the source metal 1110 to the conductive material 710 of the bottom trench 610a is illustrated, while two ohmic contacts 1220 from the gate metal 1120 to the conductive material 710 of the top trench 610a is illustrated. In this arrangement, the illustrated passive component circuit would be configured to implement one source to drain capacitor and one gate to drain capacitor for the MOSFET 305. In this arrangement, the conductive material 710 in each of the trenches 610a would define (act as, etc.) respective top plates of those capacitors, while the pillars 310 (which can be electrically coupled with a drain terminal of the MOSFET 305) would define (act as, etc.) a common (shared) bottom plate of both capacitors. As discussed herein, the first cavities 810a, the second cavities 910a, in combination with the dielectric film 535 and the dielectric film 635 can define (act as, etc.) the respective dielectrics of those capacitors.

Figure 12D:
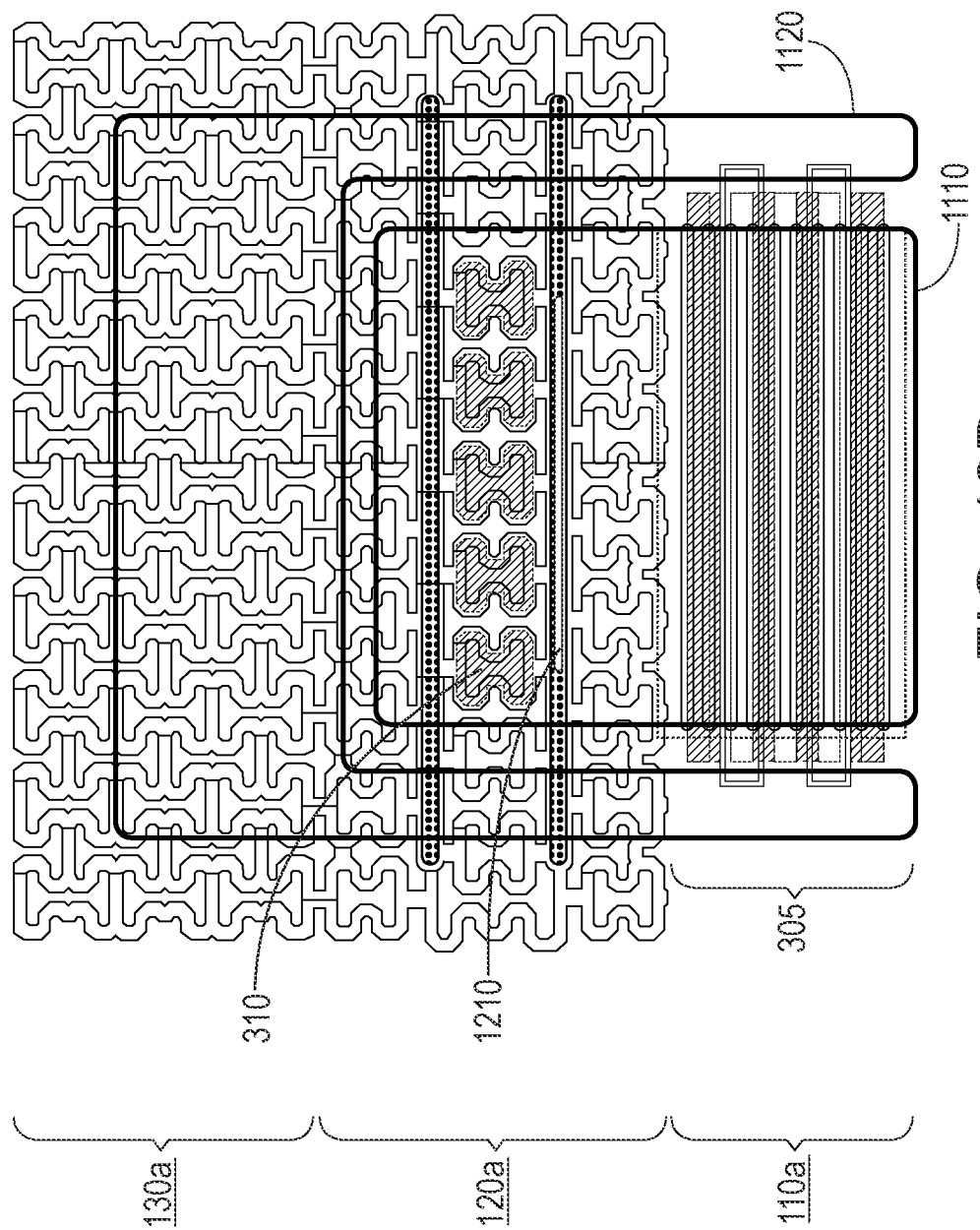

Referring to FIG. 12D, a contact 1210 from the source metal 1110 to the conductive material 710 of the bottom trench 610a is illustrated, while no contacts to the conductive material 710 of the top trench 610a are illustrated. In this arrangement, the illustrated passive component circuit would be configured to implement one source to drain capacitor for the MOSFET 305, while the other trench 610a (e.g., the top trench in the arrangement of FIG. 12D) would be a floating trench, which could, in some implementations, act as a shield structure. In this arrangement, the conductive material 710 in the bottom trench 610a would define (act as, etc.) a top plate of the single source to drain capacitor, while the pillars 310 (electrically coupled with a drain terminal of the MOSFET 305) would define (act as, etc.) a bottom plate of the capacitor. As discussed herein, the first cavities 810a, the second cavities 910a, in combination with the dielectric film 535 and the dielectric film 635 can define (act as, etc.) the dielectric of the capacitors.

Figure 12E:
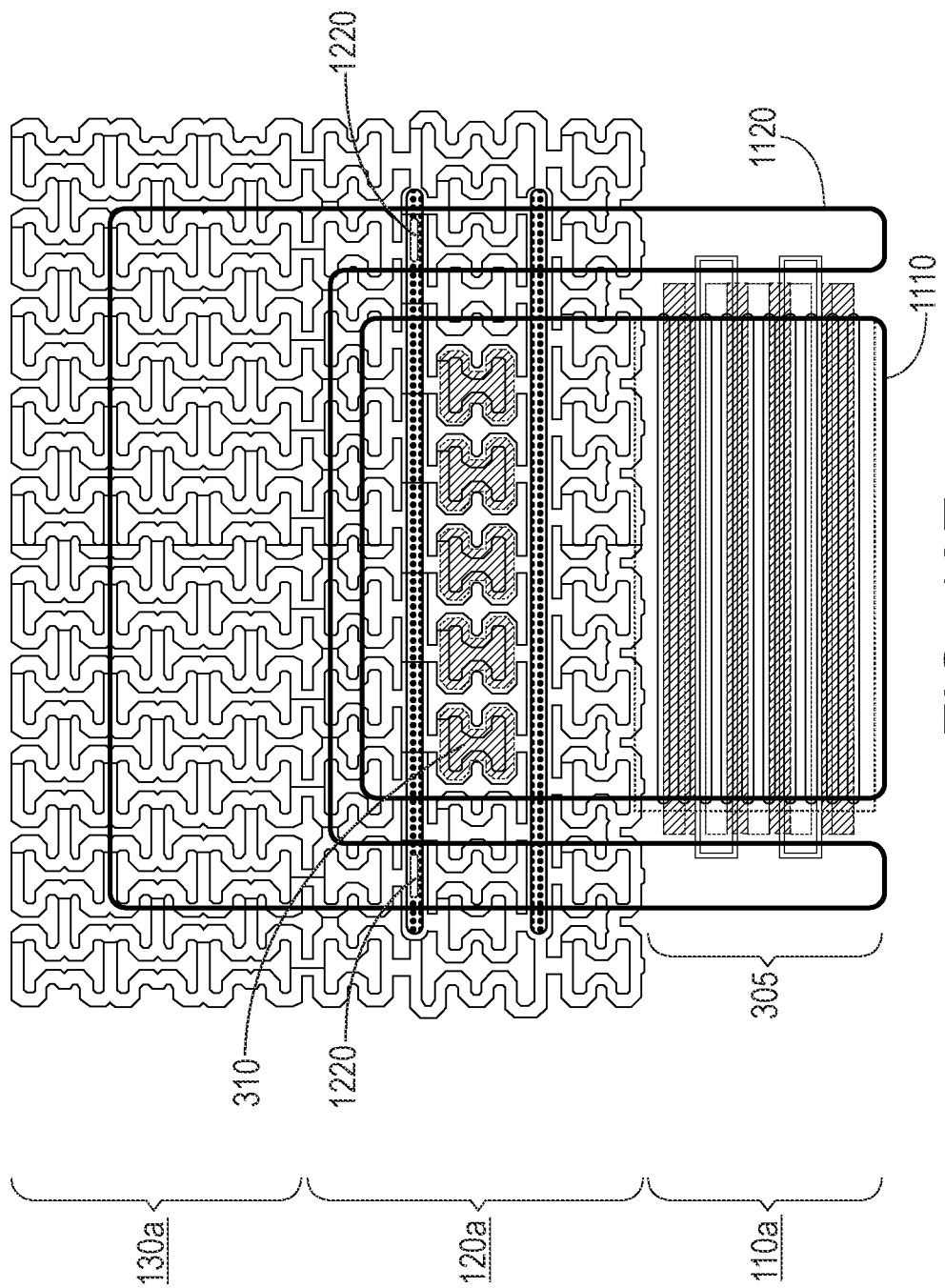

Referring to FIG. 12E, two contacts 1220 from the gate metal 1120 to the conductive material 710 of the top trench 610a are illustrated, while no contacts to the conductive material 710 of the bottom trench 610a are illustrated. In this arrangement, the illustrated passive component circuit would be configured to implement one gate to drain capacitor for the MOSFET 305, while the other trench 610a (e.g., the bottom trench in the arrangement of FIG. 12E) would be a floating trench, which could, in some implementation, act as a shield structure. In this arrangement, the conductive material 710 in the top trench 610a would define (act as, etc.) a top plate of the single gate to drain capacitor, while the pillars 310 (electrically coupled with a drain terminal of the MOSFET 305) would define (act as, etc.) a bottom plate of the capacitor. As discussed herein, the first cavities 810a, the second cavities 910a, in combination with the dielectric film 535 and the dielectric film 635 can define (act as, etc.) the dielectric of the capacitor.

Figure 12F:
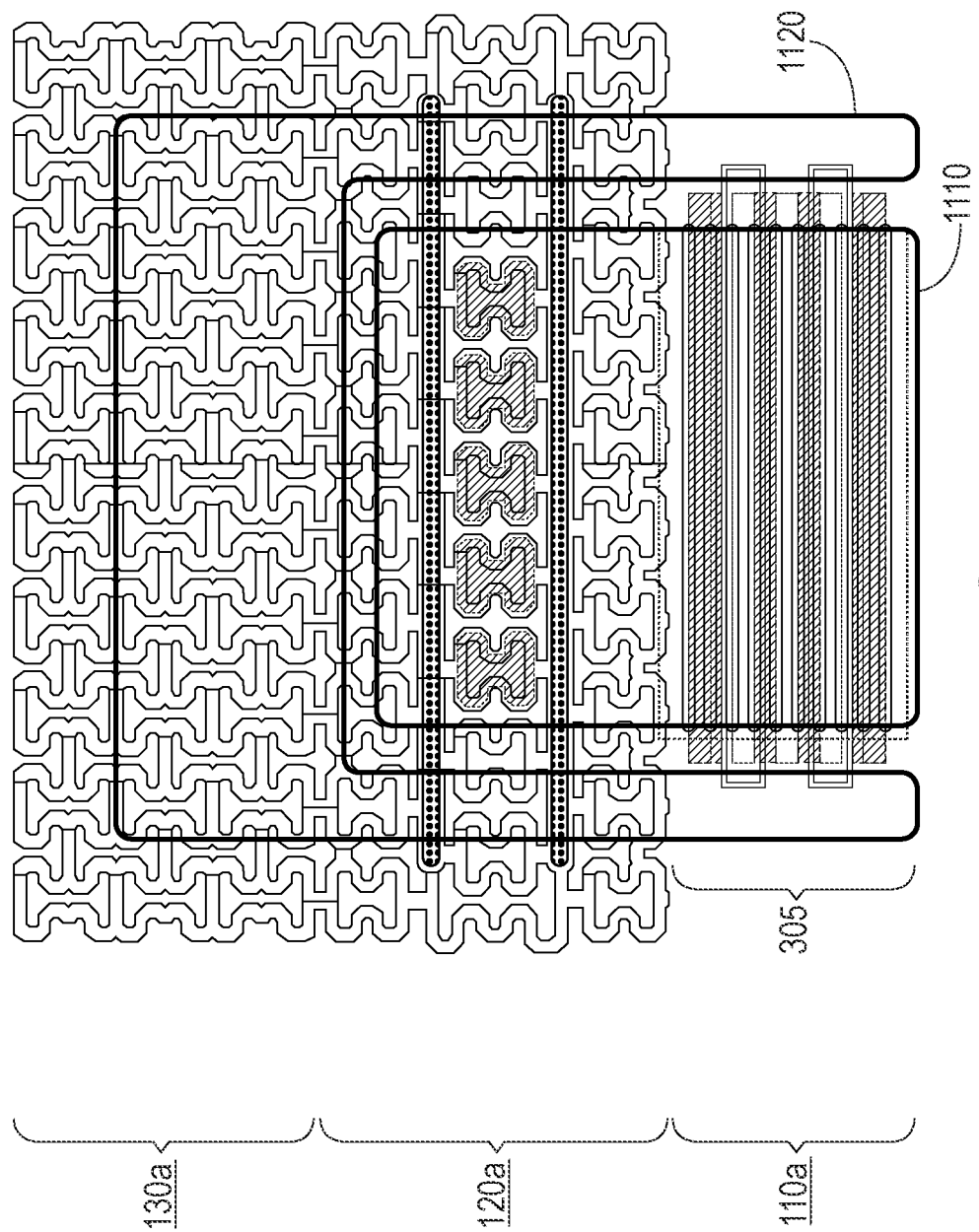

Referring to FIG. 12F, no contacts to the conductive material 710 of either of the trenches 610a are illustrated. In this arrangement, the illustrated passive component circuit would be configured to implement two floating trenches of conductive material 710, which could, in some implementation, act as a shield structure.

Referring to FIG. 12G, as compared to FIGS. 12A-12F, the gate metal 1120 is modified (e.g., separated into two pieces), and contacts 1220 to the two pieces of the gate metal 1120 are made to the conductive material 710 of each of trenches 610a at respective ends of the trenches. In this configuration, the passive component circuit of FIG. 12G can implement two gate connected resistors, with the conductive material 710 in each the trenches 610a acting as a respective gate connected resistors.

By way of example, capacitance values were determined, by simulation for an implementation of the example implementation of FIG. 12C, with one source to drain capacitor and one gate to drain capacitor. For this example, various capacitance values were determined for a capacitor width of approximately 19.5 millimeters, with a depth of the trenches 610a (e.g., height of the top capacitor plate) being in a range of 35 to 40 micrometers (um). For this example, a capacitance between the gate connected capacitor trench and both the drain and source connected capacitor trench (Ciss) was determined. Further, a capacitance between the drain and both the source connected capacitor trench and the gate connected capacitor trench (Coss) was determine. Still further, a capacitance between the gate connected capacitor trench and the drain (Crss) was determined. In the simulations, all capacitors structures demonstrate the capability of high voltage operation (e.g., greater than 700 V). In this example, Ciss was determined to be approximately 6 picofarads (pf), Coss was determined to be approximately 12 pf, and Crss was determined to be approximately 3 pf.

Figure 13A:
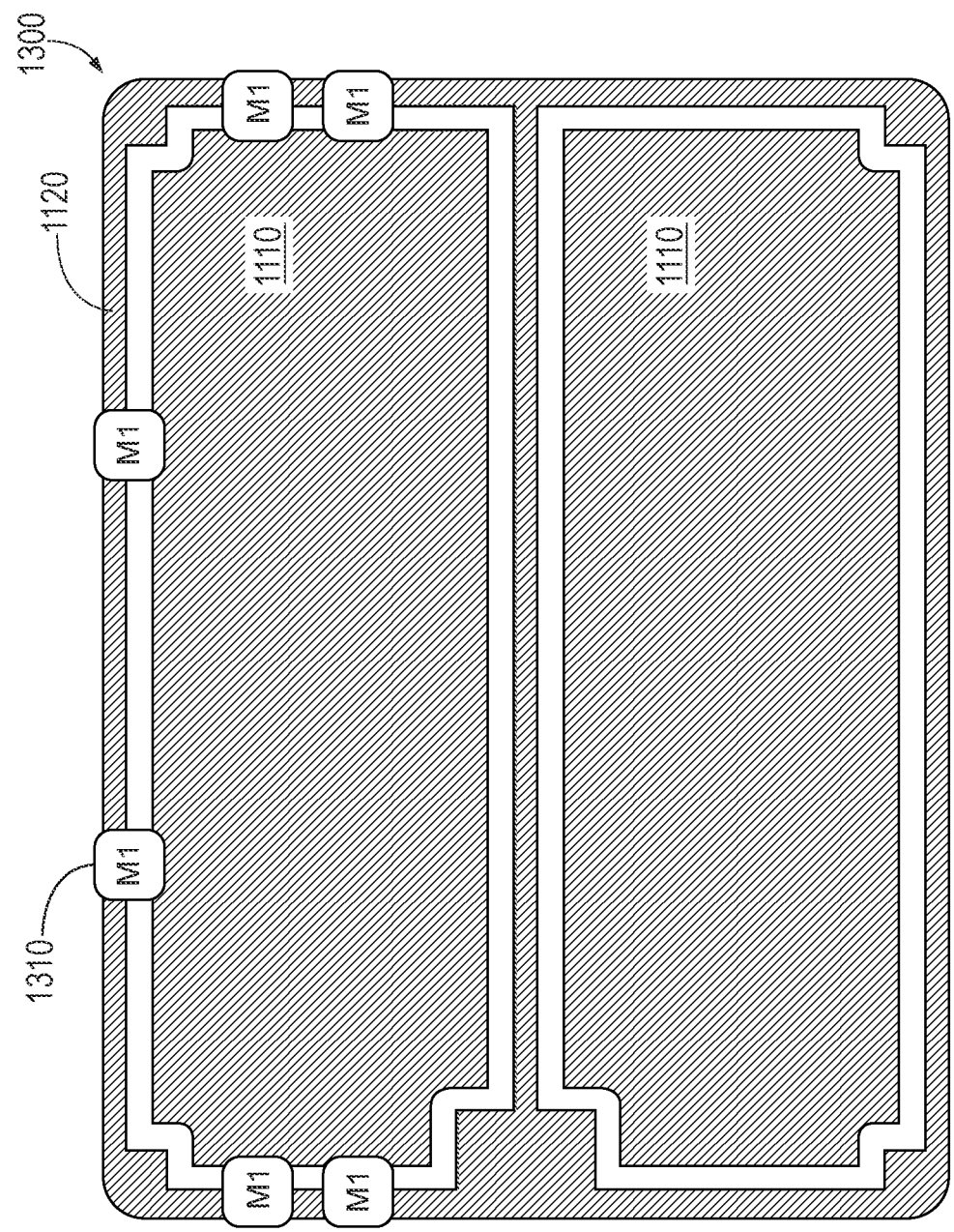
FIGS. 13A and 13B are diagrams that schematically illustrate plan views of semiconductor devices including passive component circuits, such as those illustrated in FIGS. 12A-12G.
Figure 13B:
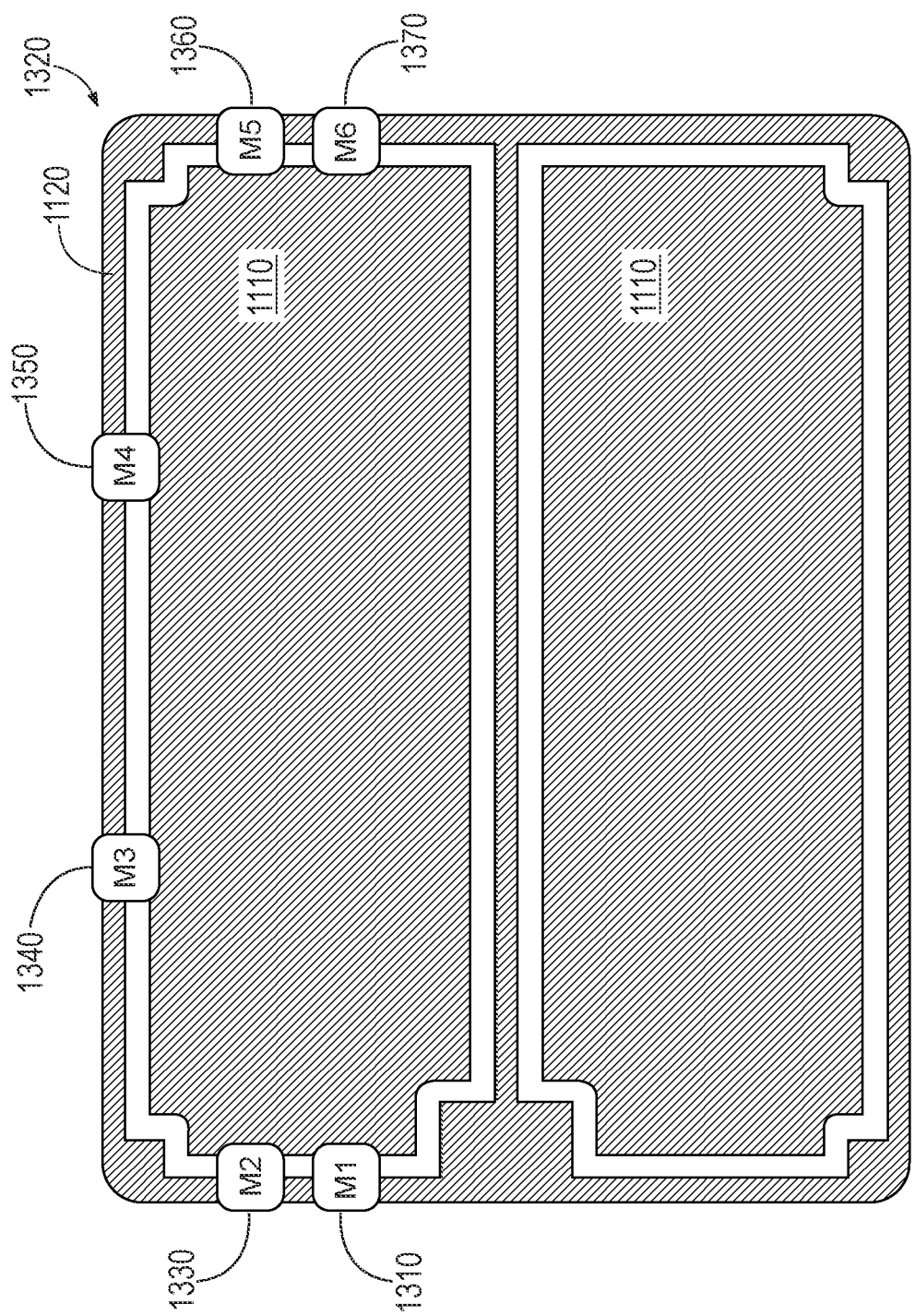

FIGS. 13A and 13B are diagrams that schematically illustrate plan views of semiconductor devices that include passive component circuits, such as those illustrated in FIGS. 12A-12G. For example, FIG. 13A illustrates a plan view of a semiconductor device 1300, and FIG. 13B illustrates a plan view of a semiconductor device 1320. The semiconductor devices 1300 and 1320 of FIGS. 13A and 13B can be implementations of a semiconductor device such as those described herein. In FIGS. 13A and 13B, source metal 1110 and gate metal 1120 are shown (e.g., such as were discussed with respect to FIGS. 11A-11B and 12A-12G).

As shown in FIG. 13A, the semiconductor device 1300 can include a plurality of passive component circuits 1310, which in this example can be of a same configuration M1, where the passive component circuits 1310 can be distributed on the semiconductor device 1300 (e.g., around a perimeter of the semiconductor device 1300). In some implementations, the passive component circuits 1310 can be selected from the example implementations of FIGS. 12A-12G, or can be passive component circuits having other implementations.

As shown in FIG. 13B, the semiconductor device 1320 can include a plurality of passive component circuits of different configurations (e.g., M1, M2, M3, M4, M5 and M6), though fewer or more passive component circuits could be included in the semiconductor device 1300 and/or the semiconductor device 1320. That is, as shown in FIG. 13B, the semiconductor device 1320 can have passive component circuits 1310, 1330, 1340, 1350, 1360 and 1370. In some implementations, the passive component circuit can be respectively selected from the example configurations of FIGS. 12A-12G, or passive component circuits having other configurations can be used in the semiconductor device 1320.

Figure 14A:
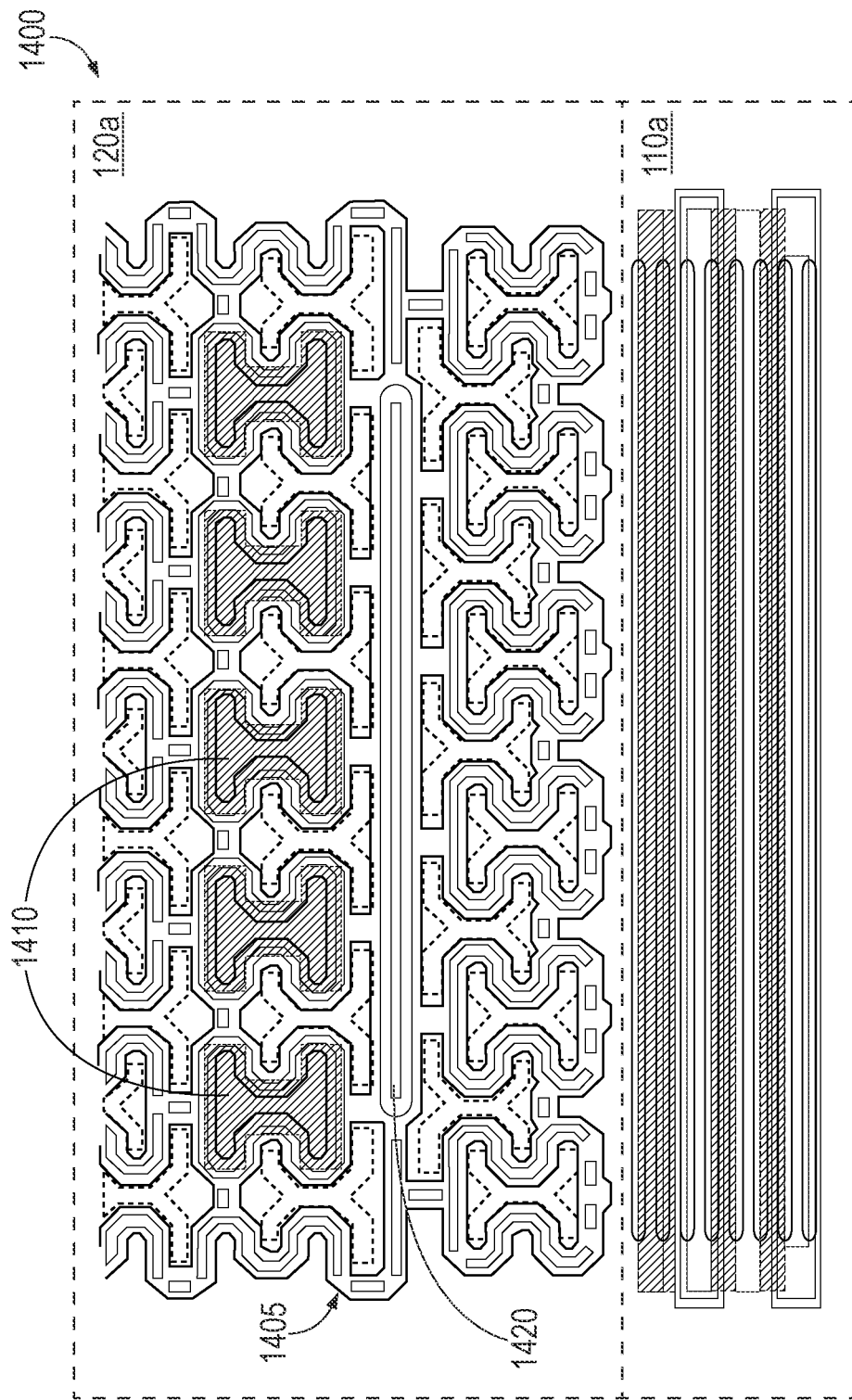
FIG. 14A is a layout view of semiconductor device including a shield structure implemented using the trench structures described herein.

FIG. 14A is a layout view of a semiconductor device 1400 (e.g., a portion of a semiconductor device, such as the portions 110a and 120a of the inset 140 of the semiconductor device shown in FIGS. 1A and 1B, and of the example semiconductor device of FIGS. 3A-11D. As shown in FIG. 14A, the semiconductor device 1400 includes a shield structure 1405, which can be implemented using the approaches for producing dielectric lattice implemented trench structures described herein. For instance, the shield structure 1405 can include pillars 1410 (e.g., n-type pillars such as the pillars 310). Further, the shield structure 1405 can include a trench 1420 (e.g., a suspended trench, such as the trenches 610a). As with the passive component circuits and dielectric lattice implemented trench structures described herein, the trench 1420 can be filled with a conductive material (e.g., such as doped polysilicon). In some implementations, the conductive material of the trench may or may not be contacted to source or gate metal. The specific configuration for a given shield structure 1405 will depend on the particular implementation.

Figure 14B:
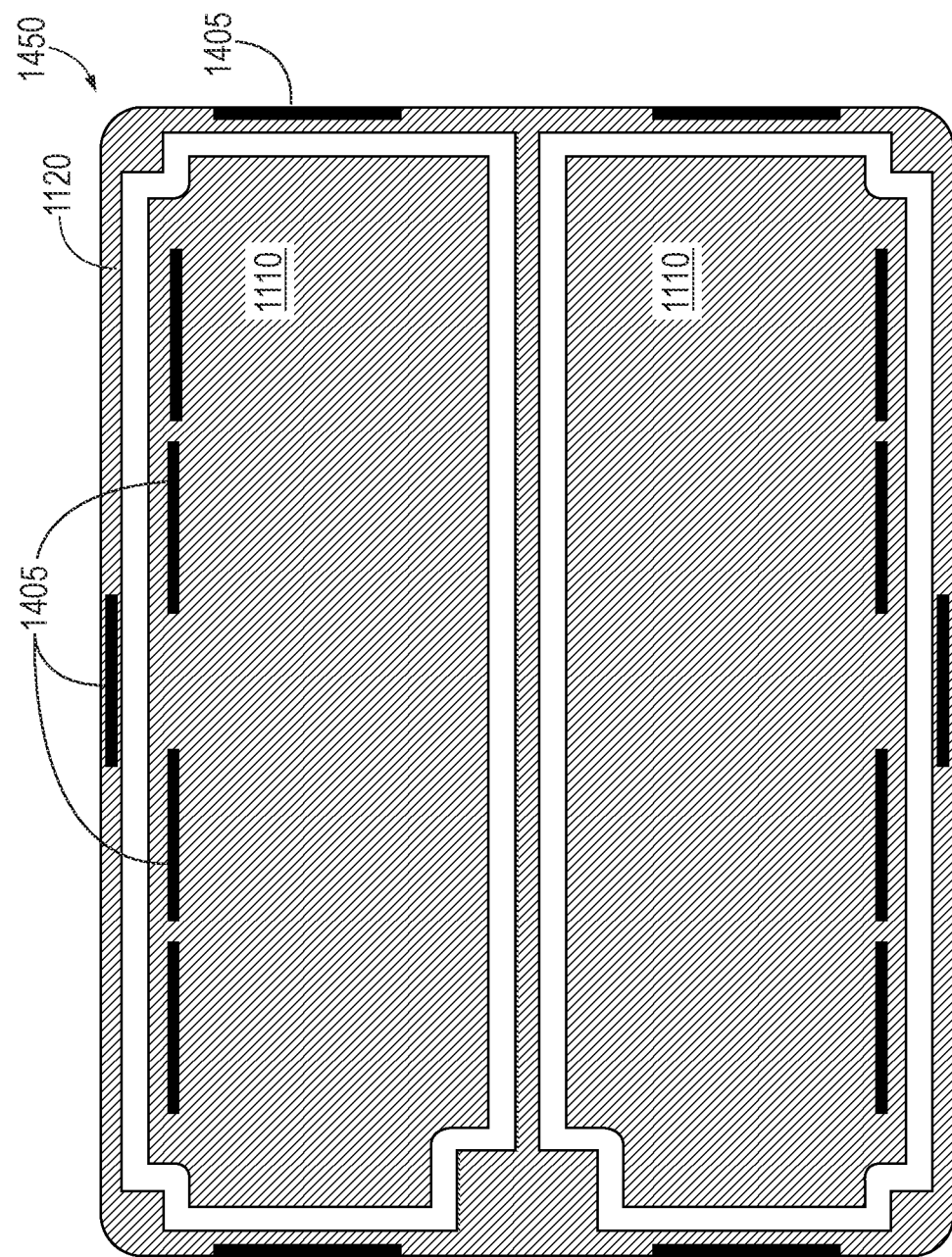
FIG. 14B is a plan view of a semiconductor die including shield structures, such as the shield structure of FIG. 14A.

FIG. 14B is a plan view of a semiconductor device 1450 including a plurality of shield structures 1405, such as the shield structure of FIG. 14A. In FIG. 14B, as in FIGS. 13A and 13B, source metal 1110 and gate metal 1120 are indicated. As shown in FIG. 14, the shield structures 1405 can be placed around a perimeter of the die 1450, where a first portion of the shield structures 1405 are placed under the source metal 1110, and a second portion of the shield structures 1405 are placed under the gate metal 1120. While FIG. 14B shows the shield structures 1405 implemented as segments, in some implementations, the shield structure 1405 could be implemented as a continuous shield around the perimeter of the die 1450. Again, depending on the implementation, a conductive material of the shield structures 1405 of FIG. 14B may, or may not be electrically coupled to a metal layer (e.g., source metal 1110 or gate metal 1120) disposed above the respective shield structures 1405.

While a number of example implementations have been illustrated and described herein, other arrangements of elements of a passive component circuit are possible using approaches such as those described herein. The following discussion briefly describes a number of alternative passive component circuit arrangements that can be implemented using corresponding modular, common circuit layout arrangements.

For instance, using the approaches for implementing trench structures described herein (e.g., implemented using suspended trenches defined by a dielectric film lattice matrix and filled with conductive material), a passive component circuit that includes a single trench and multiple doped semiconductor pillars (e.g., disposed on both sides of the trench) can be implemented. In such an example implementation, the semiconductor pillars can be electrically coupled with a drain terminal of a corresponding MOSFET via a semiconductor region and/or via a metal layers in combination with one or more ohmic contacts. In such an arrangement, the semiconductor pillar can operate in depletion mode to provide a capacitor function of the passive component circuit.

In another example, a single trench filled with a conductive material can be used in combination with multiple undoped silicon pillars (e.g., disposed on both sides of the trench), where the silicon pillars operate in inversion mode, and be electrically coupled to a MOSFET drain via a metal layer and ohmic contact(s).

In another example, a single trench can be implemented with multiple doped semiconductor pillars (e.g., disposed on both sides of the trench), with the pillars being doped with an opposite conductivity type than an associated semiconductor region (and operate in depletion mode). The pillars can be electrically coupled to a MOSFET drain via a metal layer and ohmic contact(s).

In another example implementation, a single trench can be implemented with multiple pillars, and operate as a barrier inversion capacitor. The pillars can be electrically coupled to a MOSFET drain via a metal layer and ohmic contact(s).

In other example implementations, each of the implementations discussed above can also be implemented using multiple trenches (e.g., with conductive material disposed therein) in combination with a single semiconductor pillar (e.g., doped as indicated if foregoing discussion). Furthermore, two or more trench structures can be arranged in parallel without any semiconductor pillars in between. This configuration can reduce the capacitance between the trenches and the semiconductor region, which can be useful for implementing resistors. FIG. 11D illustrates an example of this structure in cross-sectional view.

It will be understood, for purposes of this disclosure, that when an element, such as a layer, a region, or a substrate, is referred to as being on, disposed on, connected to, electrically connected to, coupled to, or electrically coupled to another element, it may be directly on, connected or coupled to the other element, or one or more intervening elements may be present. In contrast, when an element is referred to as being directly on, directly disposed on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to, or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), gallium arsenide (GaAs), gallium nitride (GaN), silicon carbide (SiC), and/or so forth.

While certain features of various example implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device comprising:
   a semiconductor region;
   an active region disposed in the semiconductor region; and
   a termination region disposed on the semiconductor region and adjacent to the active region, the termination region including:
   a trench having a conductive material disposed therein;
   a first cavity separating the trench from the semiconductor region, a portion of the first cavity being disposed between a bottom of the trench and the semiconductor region; and
   a second cavity separating the trench from the semiconductor region.

2. The semiconductor device of claim 1, wherein:
   the portion of the first cavity is a first portion of the first cavity;
   a second portion of the first cavity is disposed along a first sidewall of the trench; and
   a portion of the second cavity is disposed along a second sidewall of the trench.

3. The semiconductor device of claim 1, wherein the termination region further includes:
   a three-dimensional dielectric film lattice defining a plurality of cavities including the first cavity and the second cavity,
   a first sidewall of the trench, a second sidewall of the trench, and the bottom of the trench being defined by a portion of the three-dimensional dielectric film lattice, the first sidewall of the trench, the second sidewall of the trench, and the bottom of the trench being disposed on the conductive material.

4. The semiconductor device of claim 3, wherein the portion of the three-dimensional dielectric film lattice defining the trench, along a vertical line orthogonal to the semiconductor region, is suspended above the semiconductor region.

5. The semiconductor device of claim 4, wherein the portion of the three-dimensional dielectric film lattice defining the trench is suspended above the semiconductor region by a dielectric film of the three-dimensional dielectric film lattice.

6. The semiconductor device of claim 5, wherein:
   the dielectric film of the three-dimensional dielectric film lattice is a first dielectric film;
   the termination region further includes a pillar of the semiconductor region disposed within a second dielectric film, the pillar of the semiconductor region defining a first plate of a capacitor;
   the conductive material defines a second plate of the capacitor; and
   the first dielectric film, the second dielectric film and the first cavity define, at least in part, a dielectric of the capacitor.

7. The semiconductor device of claim 1, wherein the conductive material is doped polysilicon.

8. The semiconductor device of claim 1, wherein:
   the termination region further includes a pillar of the semiconductor region disposed within a dielectric film, the pillar of the semiconductor region defining a first plate of a capacitor;
   the conductive material defining a second plate of the capacitor;
   the dielectric film and the first cavity defining, at least in part, a dielectric of the capacitor.

9. The semiconductor device of claim 8, further comprising:
   a transistor disposed in the active region,
   the conductive material being electrically coupled with one of a gate terminal or a base terminal of the transistor, and
   the pillar of the semiconductor region being electrically coupled with one of a drain terminal or a collector terminal of the transistor.

10. The semiconductor device of claim 8, further comprising:
a transistor disposed in the active region,
the conductive material being electrically coupled with one of a source terminal or an emitter terminal of the transistor, and
the pillar of the semiconductor region being electrically coupled with one of a drain terminal or a collector terminal of the transistor.

11. The semiconductor device of claim 1, wherein the trench is disposed along a perimeter of the active region.

12. The semiconductor device of claim 1, wherein:
the termination region further includes a pillar of the semiconductor region disposed within a dielectric film, the trench being disposed between the active region and the pillar, the first cavity separating the trench from the pillar.

13. A capacitor comprising:
a semiconductor region defining a first plate of the capacitor;
a trench having a conductive material disposed therein, the conductive material defining a second plate of the capacitor; and
a cavity separating the trench from the semiconductor region, a portion of the cavity being disposed between a bottom of the trench and the semiconductor region, the cavity being included in a dielectric of the capacitor.

14. The capacitor of claim 13, further comprising:
a three-dimensional dielectric film lattice defining a plurality of cavities including the cavity separating the trench from the semiconductor region,
a first sidewall of the trench, a second sidewall of the trench, and a bottom of the trench being defined by the three-dimensional dielectric film lattice, the first sidewall of the trench, the second sidewall of the trench, and the bottom of the trench being disposed on the conductive material.

15. The capacitor of claim 14, wherein the cavity is a first cavity, the capacitor further comprising:
a second cavity separating the trench from the semiconductor region, a portion of the three-dimensional dielectric film lattice separating the first cavity from the second cavity.

16. The capacitor of claim 13, wherein the semiconductor region includes a semiconductor pillar included in the first plate of the capacitor, the cavity being disposed between the trench and the semiconductor pillar.

17. A semiconductor device comprising:
a semiconductor region;
an active region disposed in the semiconductor region;
a transistor disposed in the active region; and
a termination region disposed on the semiconductor region and adjacent to the active region, the termination region including:
a trench having a conductive shield material disposed therein;
a first cavity separating the trench from the semiconductor region, a portion of the first cavity being disposed between a bottom of the trench and the semiconductor region; and
a second cavity separating the trench from the semiconductor region.

18. The semiconductor device of claim 17, wherein the termination region further includes:
a three-dimensional dielectric film lattice defining a plurality of cavities including the first cavity and the second cavity,
a first sidewall of the trench, a second sidewall of the trench, and a bottom of the trench being defined by the three-dimensional dielectric film lattice, the first sidewall of the trench, the second sidewall of the trench, and the bottom of the trench being disposed on the conductive shield material.

19. The semiconductor device of claim 17, further comprising a metal layer electrically coupled with one of a source terminal or an emitter terminal of the transistor, the metal layer being disposed over the trench.

20. The semiconductor device of claim 17, further comprising a metal layer electrically coupled with one of a gate terminal or a base terminal of the transistor, the metal layer being disposed over the trench.

* * * * *